United States Patent
Zhang et al.

(10) Patent No.: US 9,257,939 B1
(45) Date of Patent: Feb. 9, 2016

(54) QUADRATURE LC VCO WITH PASSIVE COUPLING AND PHASE COMBINING NETWORK

(71) Applicant: The Board of Regents, The University of Texas System, Austin, TX (US)

(72) Inventors: Jing Zhang, Dallas, TX (US); Kenneth K. O, Plano, TX (US); Navneet Sharma, Richardson, TX (US)

(73) Assignee: The Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/472,653

(22) Filed: Aug. 29, 2014

(51) Int. Cl.
*H04B 1/06* (2006.01)
*H04B 7/00* (2006.01)
*H04B 1/16* (2006.01)
*H03B 5/12* (2006.01)
*H03B 1/04* (2006.01)

(52) U.S. Cl.
CPC ............ *H03B 5/1212* (2013.01); *H03B 1/04* (2013.01); *H03B 5/124* (2013.01); *H03B 5/1256* (2013.01)

(58) Field of Classification Search
CPC .... H03B 27/00; H03B 5/1231; H03B 5/1209; H03B 5/1221; H03B 5/08; H03B 5/12; H03D 7/1441; H03D 7/1475; H03D 7/1483; H03D 7/165; H03D 7/1458; H03D 2200/0086; H03D 2200/0033; H03K 3/0322; H03K 5/133; H03K 2005/00176; H03K 3/03; H03K 5/13; H03K 5/00; H04B 1/06; H04B 7/00; H04B 1/16; H04B 1/26
USPC ........... 455/264, 196.1, 195.1, 208, 209, 255, 455/258–259, 265, 260–262
See application file for complete search history.

(56) References Cited

U.S. PATENT DOCUMENTS

| | | | | |
|---|---|---|---|---|
| 6,690,243 B1 * | 2/2004 | Henrion | ................ | H03B 5/20 331/117 R |
| 7,026,880 B2 * | 4/2006 | Shi | .............. | H03B 27/00 331/46 |
| 7,146,140 B2 * | 12/2006 | Ravi | ............ | H03B 5/14 331/135 |
| 7,271,672 B2 * | 9/2007 | Sanduleanu | ......... | H03L 7/0893 331/117 FE |
| 7,292,113 B2 * | 11/2007 | Rohde | ............. | G06K 13/0825 331/117 R |
| 7,383,033 B2 * | 6/2008 | Holger | .............. | H03L 7/0995 455/255 |
| 7,394,321 B2 * | 7/2008 | Conta | ............. | H03L 7/07 331/12 |
| 7,847,650 B2 * | 12/2010 | Yao | ............. | H03B 27/00 331/117 FE |
| 7,978,785 B2 * | 7/2011 | Leifso | .............. | H03B 19/14 327/122 |

(Continued)

OTHER PUBLICATIONS

M. Tiebout, "A CMOS fully integrated 1GHz and 2GHz dual bank VCO with a voltage controlled inductor," Proc. of ESSCIRC, Sep. 2002, pp. 799-802.

(Continued)

*Primary Examiner* — Pablo Tran
(74) *Attorney, Agent, or Firm* — Schultz & Associates, P.C.

(57) ABSTRACT

A circuit and method for generating a signal is disclosed. The circuit includes a set of wide tuning LC tanks, a set of core transistors cross coupled to the set of wide tuning LC tanks, and a combining network coupled to the set of wide tuning LC tanks and the set of core transistors. The combining network further includes a set of inputs connected to the set of wide tuning LC tanks and the set of core transistors, a set of coupling transistors connected to the set of inputs, a set of source inductors connected to the set of coupling transistors, a coupling capacitor connected to the set of source inductors, a load resistor connected to the coupling capacitor. The combining network combines the set of inputs and the signal is delivered to the load resistor as a fourth order harmonic.

19 Claims, 16 Drawing Sheets

(56) References Cited

U.S. PATENT DOCUMENTS

| | | | | |
|---|---|---|---|---|
| 8,198,945 B2 * | 6/2012 | Sanduleanu | ......... | H03B 27/00 331/117 R |
| 2003/0119456 A1 * | 6/2003 | Maligeorgos | ......... | H03B 27/00 455/87 |

OTHER PUBLICATIONS

A.W.L. Ng and H.C. Luong, "A 1-V 17-GHz 5-mW CMOS Quadrature VCO Based on Transformer Coupling," IEEE Journal of Solid-State Circuits, Sep. 2007, pp. 1933-1941, vol. 42, No. 9.

S. L J Gierkink, S. Levantino, R.C. Frye, C. Samori, and V. Boccuzzi, "A Low-Phase-Noise 5-GHz CMOS Quadrature VCO Using Superharmonic Coupling," IEEE Journal of Solid-State Circuits, Jul. 2003, pp. 1148-1154, vol. 38, No. 7.

Xiang Yi, Chirn Chye Boon, Jia Fu Lin, and Wei Meng Lim, "A 100 GHz Transformer-Based Varactor-Less VCO with 11.2% Tuning Range in 65nm CMOS Technology," Proc. of ESSCIRC, 2012, pp. 293-296.

Jing Zhang, Navneet Sharma and Kenneth K. O, "21.5-to-33.4 GHz Voltage-Controlled Oscillator Using NMOS Switched Inductors in CMOS", IEEE Microwave and Wireless Components Letters, vol. 24, No. 7, Jul. 2014.

I. R. Medvedev, C. F. Neese, G. M. Plummer, and F. C. Lucia, "Submillimeter spectroscopy for chemical analysis with absolute specificity," Optics Letters, May 2010, pp. 1533-1535, vol. 35, Issue 10.

E. Seok, D. Shim, C. Mao, R. Han, S. Sankaran, C. Cao, W. Knap, K.K. O, "Progress and challenges towards terahertz CMOS integrated circuits," IEEE Journal of Solid-State Circuits, Aug. 2010, pp. 1554-1564, vol. 45, Issue 8.

L. M. Franca-Neto, R. R. Bishop and B. A. Bloechel, "64 GHz and 100 GHz VCOs in 90 nm CMOS using optimum pumping method," ISSCC Dig. Tech. Papers, Feb. 2004, pp. 444-538.

P.-C. Huang, M.D. Tsai, G. D. Vendelin, H. Wang, C.-H. Chen, C.-S. Chang, "A low power 114-GHz push-push CMOS VCO using LC source degeneration," IEEE Journal of Solid State Circuits, Jun. 2007, pp. 1230-1239, vol. 42, No. 6.

D. Huang, T. R. Larocca, M.-C. F. Chang, L. Samoska, A. Fung, R. L. Campbell, and M. Andrews, "Terahertz CMOS Frequency Generator Using Linear Superposition Technique," IEEE Journal of Solid-State Circuits, Dec. 2008, pp. 2730-2738, vol. 43, No. 12.

B. Razavi, "A 300-GHz fundamental oscillator in 65-nm CMOS technology," IEEE Journal of Solid-State Circuits, Apr. 2011, pp. 894-903, vol. 46, Issue 4.

D. Shim, D. Koukis, D. J. Arenas, D. B. Tanner, and K. K. O, "553-GHz signal generation in CMOS using a quadruple-push oscillator," Symp. of VLSI Circuits Dig. Tech. Papers, Jun. 2011, pp. 154-155.

C. Cao and K. K. O, "Millimeter-wave voltage-controlled oscillators in 0.13-μm CMOS technology," IEEE Journal of Solid-State Circuits, Jun. 2006, pp. 1297-1304, vol. 41, No. 6.

J. C. Chien and L. H. Lu, "Design of wide-tuning-range millimeter-wave CMOS VCO with standing wave architecture," IEEE Journal of Solid-State Circuits, Sep. 2007, pp. 1942-1952, vol. 42, No. 9.

J. Yin and H. C. Luong, "A 57.5-90.1GHz magnetically-tuned multi-mode CMOS VCO," IEEE Journal of Solid-State Circuits, Aug. 2013, pp. 1851-1861, vol. 48.

S. Saberi and J. Paramesh, "A 11.5-22GHz dual-resonance transformer-coupled quadrature VCO," RFIC Symp. Dig. Papers, Jun. 2011, pp. 1-4.

Y. M. Tousi, O. Momeni, and E. Afshari, "A 283-to-296GHz VCO with 0.76mW Peak Output Power in 65nm CMOS," ISSCC Dig. Tech. Papers, Feb. 2012, pp. 258-259.

N. Zhang and K. K. O, "94GHz voltage controlled oscillator with 5.8% tuning range in bulk CMOS," IEEE Microwave and Wireless Components Letters, Aug. 2008, pp. 548-550, vol. 18, No. 8.

D. D. Kim, J. Kim, C. Cho, J.-O. Plouchart, M. Kumar, W. Lee, and K. Rim, "An array of 4 complementary LC-VCOs with 51.4% W-Band coverage in 32 nm SOI CMOS," ISSCC Dig. Tech. Papers, Jan. 2009, pp. 278-279.

W. Volkaerts, M. Steyaert and P. Reynaert, "118GHz fundamental VCO with 7.8% turning range in 65 nm CMOS," RFIC Symp. Dig. Papers, Jun. 2011, pp. 1-4.

S. Yim and K. K. O, "Demonstration of a switched resonator concept in a dual-band monolithic CMOS LC-tuned VCO," Proc. of CCIC, May 2001, pp. 205-208.

Z. Li and K. K. O, "A low-phase-noise and low-power multiband CMOS voltage-controlled oscillator," IEEE Journal of Solid-State Circuits, Jun. 2005, pp. 1296-1302, vol. 40, No. 6.

* cited by examiner

QUADRATURE LC VCO WITH PASSIVE COUPLING AND PHASE COMBINING NETWORK

FIELD OF THE INVENTION

The present invention relates to electromagnetic signal generation. In particular, the present invention relates to electromagnetic signal generation using voltage controlled oscillators.

BACKGROUND OF THE INVENTION

Electro-magnetic waves in the millimeter and sub-millimeter wave frequency range, from 100 to 1000 GHz, are being utilized in fast-scan rotational spectroscopy for detection and identification of gas molecules. This technique is used for monitoring indoor air quality, gas leaks, human breath, and others for a wide variety of medical, security, and safety applications. Advances of the high frequency capability of CMOS have made it possible to consider CMOS as an affordable means for implementing the electronics for these spectroscopy systems, in which a signal generation circuit operating at 100 GHz and higher with an ultra-wide frequency tuning range, approximately 50%, is a key component. The rotational spectroscopy application is particularly well suited for CMOS implementation because it requires only a few micro-watt of transmitted power to avoid the saturation of molecules. This is significantly different from communication or radar applications in which high transmitted power is needed.

Recently, numerous millimeter-wave CMOS signal generation circuits/LC oscillators have been reported. These circuits are categorized into three groups based on their focus. The first group generates signals at frequencies as high as possible. For example, a 300-GHz fundamental mode VCO in 65-nm CMOS demonstrated that the fundamental oscillation frequency of an oscillator approaches the $f_{max}$ of technology. By employing a frequency multiplication technique in conjunction with an oscillator, signals are generated beyond $f_{max}$. As another example, 553-GHz signal was generated by using a 4-push technique in 45-nm CMOS. The second group increases the tuning range while minimizing phase noise degradation. For example, a 57.5-90.1 GHz oscillator with a 44% tuning range was achieved by using a magnetically-tuned multi-mode technique. The third group is focused on increasing the output power. For example, a 283-to-296-GHz VCO in 65-nm CMOS with 0.76 mW peak output power has been demonstrated. Using a triple-push technique, the output power of this CMOS signal generation circuit is significantly improved near the sub-millimeter wave frequencies.

However, all reported wide tuning millimeter wave CMOS signal generation circuits with a frequency tuning range larger than 20% operate below 90 GHz. At 100 GHz, the tuning range has been limited to less than 11%, which is far below the desired range. Therefore, there is a need in the art to dramatically increase the tuning range of signal generation circuits with output frequency greater than 100 GHz. There is a need in the art for a CMOS signal generation circuit having an approximately 50% frequency tuning range without a frequency gap.

SUMMARY

In a preferred embodiment, a circuit and method for generating a signal is disclosed. The circuit includes a set of wide tuning LC tanks, a set of core transistors cross coupled to the set of wide tuning LC tanks, and a combining network coupled to the set of wide tuning LC tank and the set of core transistors. The combining network further includes a set of inputs connected to the set of wide tuning LC tanks and the set of core transistors, a set of coupling transistors connected to the set of inputs, a set of source inductors connected to the set of coupling transistors, a coupling capacitor connected to the set of source inductors, a load resistor connected to the coupling capacitor. The combining network couples the set of LC tanks to generate a set of quadrature signals, combines the set of the quadrature signals, and the combined signal is delivered to the load resistor as a fourth order harmonic.

In another embodiment, the circuit does not include the set of source inductors.

In a preferred embodiment, the method includes the steps of injecting a set of voltages into the set of inputs, mixing each voltage of the set of voltages with a square wave in 90 degree phase shift to create a set of mixed voltages, linearly combining the set of mixed voltages into a combined voltage, and delivering the combined voltage to the load resistor at a fourth harmonic frequency.

BRIEF DESCRIPTION OF THE DRAWINGS

In the detailed description presented below, reference is made to the accompanying drawings.

DETAILED DESCRIPTION

Realizing a frequency tuning range of 50% at 100 GHz and higher desired for rotational spectroscopy is challenging for any electronic technologies including CMOS. The difficulty is due to the trade-off between frequency tuning and operation frequency arising from the fact that the capacitance of transistors needed to sustain operation becomes an increasing portion of the capacitance of LC tank that determines the operation frequency. This tradeoff is exacerbated by the fact that the quality factor of varactors and the parasitic capacitance of transistors degrade with frequency increases, which further increases the width of transistors needed to sustain oscillation and thus their capacitance. Because of this, most of CMOS signal generation circuits with fundamental oscillation frequencies above 90 GHz use small varactors or no varactors. Recently, magnetic frequency tuning techniques based on transformers and varactors have been used to demonstrate a 57.5-90.1 GHz oscillator. However, the design complexity of on-chip transformers quite often results in frequency tuning gaps.

These limitations are mitigated by generating signals at relatively lower frequencies at first, where ultra wide frequency tuning is easier to achieve. Then, proper broadband frequency multiplication techniques are applied to generate signals at the desired frequencies. Since frequency multiplication adds loss, generation of the signal at as high of frequency as possible is critical.

Figure 1:
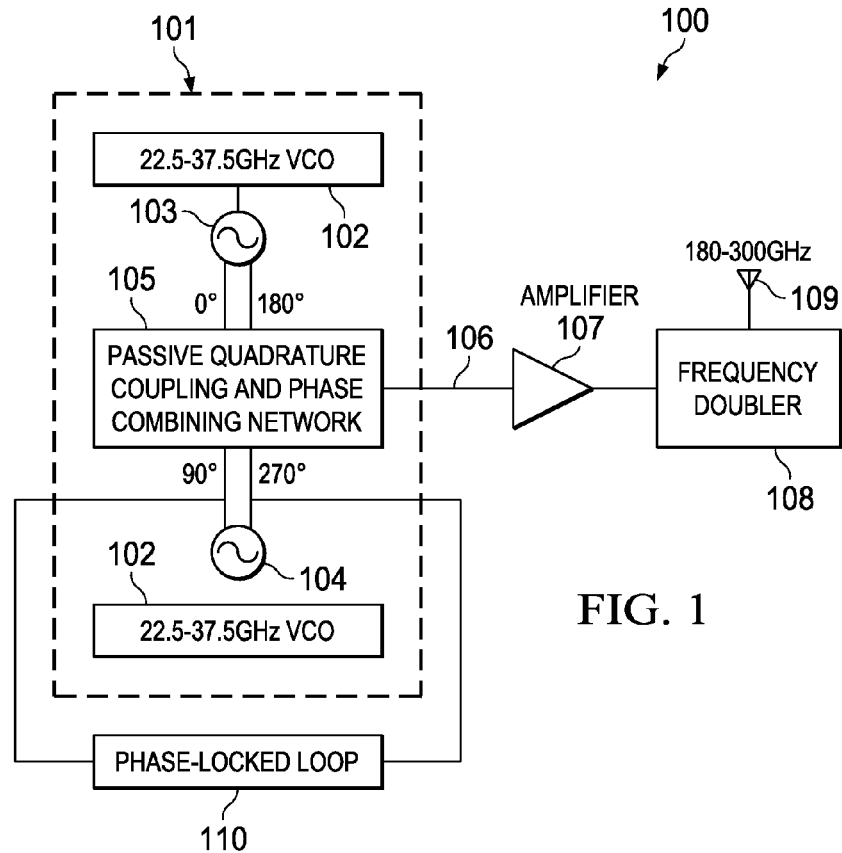
FIG. 1 is a schematic of a signal generation circuit for rotational spectroscopy of a preferred embodiment.

Referring to FIG. 1, frequency generator 100 suitable for the 180-300 GHz rotational spectroscopy is described. Circuit 101 includes VCO tank 102 operating at low end of the millimeter wave frequency range generates fundamental signals at 22.5 to 37.5 GHz. VCO tanks 103 and 104 are mutually coupled with passive quadrature coupling and phase combining network 105 to generate signal 106. Signal 106 is a 4th-order harmonic at frequencies between 90 and 150 GHz.

In one embodiment, signal 106 is further amplified by broadband amplifier 107 connected to combining network 105 and the frequency doubled with frequency doubler 108 connected to broadband amplifier 107 to finally generate the signals at approximately 180 GHz to approximately 300 GHz at connected antenna 109. For frequency synthesis, phase-locked loop 110 is connected between VCO tank 104 and combining network 105 and implemented to lock the fundamental output of VCO tank 104.

Frequency generator 100 not only relaxes the requirement on high-frequency wide-tuning oscillator design, but also mitigates the PLL design challenges since the 180-300 GHz signals do not need to be directly locked.

Other than the 50% tuning range, the required phase noise should be lower than −88 dBc/Hz at 10-MHz offset for a 120 GHz carrier, and the signal power should be −20 to −30 dBm, both specifications are significantly relaxed compared to that of other millimeter wave applications such as 60 GHz communication. The phase noise specification is related to the line width or resolution of spectrum. The signal power should be lower than approximately −20 dBm to avoid saturation of molecules. These specifications are empirically derived from the characteristics of components in sub-millimeter spectrometers.

Figure 2A:
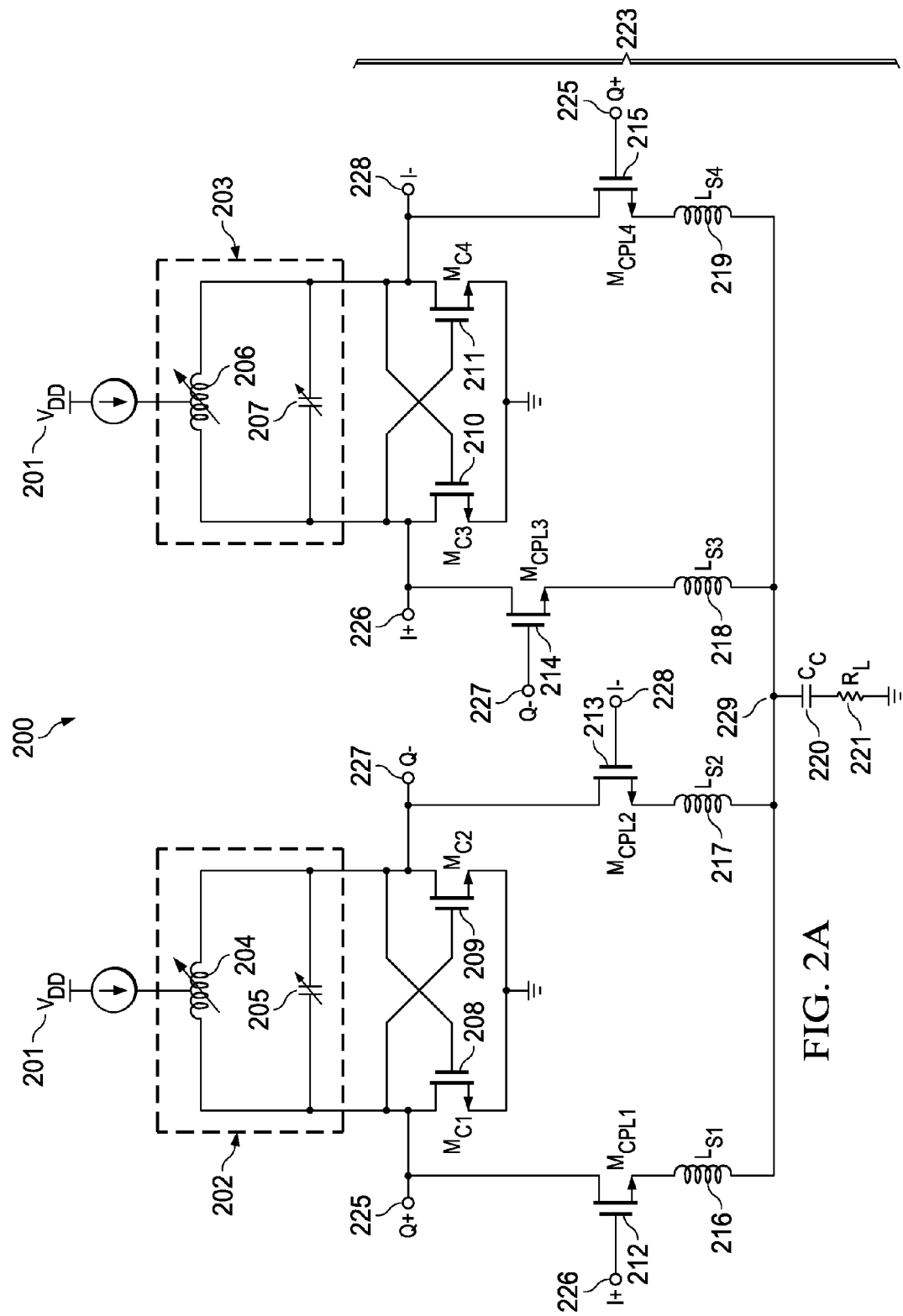
FIG. 2A is a circuit diagram of a signal generation circuit of a preferred embodiment.

Referring to FIG. 2A in a preferred embodiment, circuit 101 will be further described as signal generation circuit 200. Voltage ($V_{DD}$) 201 is connected to wide tuning LC tanks 202 and 203. Wide tuning LC tank 202 includes variable inductor 204 and varactor 205. Wide tuning LC tank 203 includes variable inductor 206 and varactor 207. Wide tuning LC tank 202 is connected to cross-coupled core transistors ($M_{C1}$ and $M_{C2}$) 208 and 209 and quadrature coupled through coupling and phase combining network 223. Wide tuning LC tank 203 is connected to cross-coupled core transistors ($M_{C3}$ and $M_{C4}$) 210 and 211 quadrature coupled through coupling and phase combining network 223. Coupling and phase combining network 223 includes transistors ($M_{CPL1-4}$) 212, 213, 214, and 215 and source inductors ($L_{S1-4}$) 216, 217, 218, and 219, coupling capacitor ($C_C$) 220 and load resistor ($R_L$) 221. Transistor ($M_{CPL1}$) 212 is connected to source inductor ($L_{S1}$) 216. Source inductor ($L_{S1}$) 216 is connected to combining node 229. Transistor ($M_{CPL2}$) 213 is connected source inductor ($L_{S2}$) 217. Source inductor ($L_{S2}$) 217 is connected to combining node 229. Transistor ($M_{CPL3}$) 214 is connected to source inductor ($L_{S3}$) 218. Source inductor ($L_{S3}$) 218 is connected to combining node 229. Transistor ($M_{CPL4}$) 215 is connected to source inductor ($L_{S4}$) 219. Source inductor ($L_{S4}$) 219 is connected to combining node 229. Coupling capacitor ($C_C$) 220 is connected to combining node 229. Load resistor ($R_L$) 221 is connected to coupling capacitor ($C_C$) 220. Input port (Q+) 225 is connected to transistors 212 and 215, core transistors 208 and 209, and wide tuning LC tank 202. Input port (I+) 226 is connected to transistors 212 and 214, core transistors 210 and 211, and wide tuning LC tank 203. Input port (Q−) 227 is connected to transistors 213 and 214, core transistors 208 and 209, and wide tuning LC tank 202. Input port (I−) 228 is connected to transistors 213 and 215, core transistors 210 and 211, and wide tuning LC tank 203.

In a preferred embodiment, source inductors ($L_{S1-4}$) 216, 217, 218, and 219 consume no dc bias current. The generated 4th-order harmonics are combined and ac-coupled to a 50-ohm resistance for load resistor ($R_L$) 221 through a 300-fF capacitance for coupling capacitor ($C_C$) 220. Coupling and phase combining network 223 provides two functions: harmonic generation and quadrature coupling, without dc consumption and low noise. Source inductors 216, 217, 218, and 219 cancel out part of a current phase shift from the coupling transistors 212, 213, 214, and 215, to the core transistors 208, 209, 210, and 211, as will be further described below.

In a preferred embodiment, signal generation circuit 200 is fabricated in 65-nm bulk CMOS and generates signals with a measured output power level of −15 to −23 dBm and phase noise of −108 to −102 dBc/Hz at 10-MHz offset. The phase noise performance exceeds the rotational spectroscopy requirement by more than 10 dB. Signal generation circuit 200 has at least 4× wider tuning range than the conventional CMOS circuits that operate above 90 GHz, and has more than 5 dB higher output power and 2 dB lower phase noise than those of the 57.5 to 90.1 GHz fundamental CMOS oscillator at the same output frequencies (85 to 90 GHz) and power efficiency.

In a preferred embodiment, signal generation circuit 200 outputs signals from approximately 90 GHz to approximately 150 GHz for an approximate 50% frequency tuning range without a frequency gap.

Figure 2B:
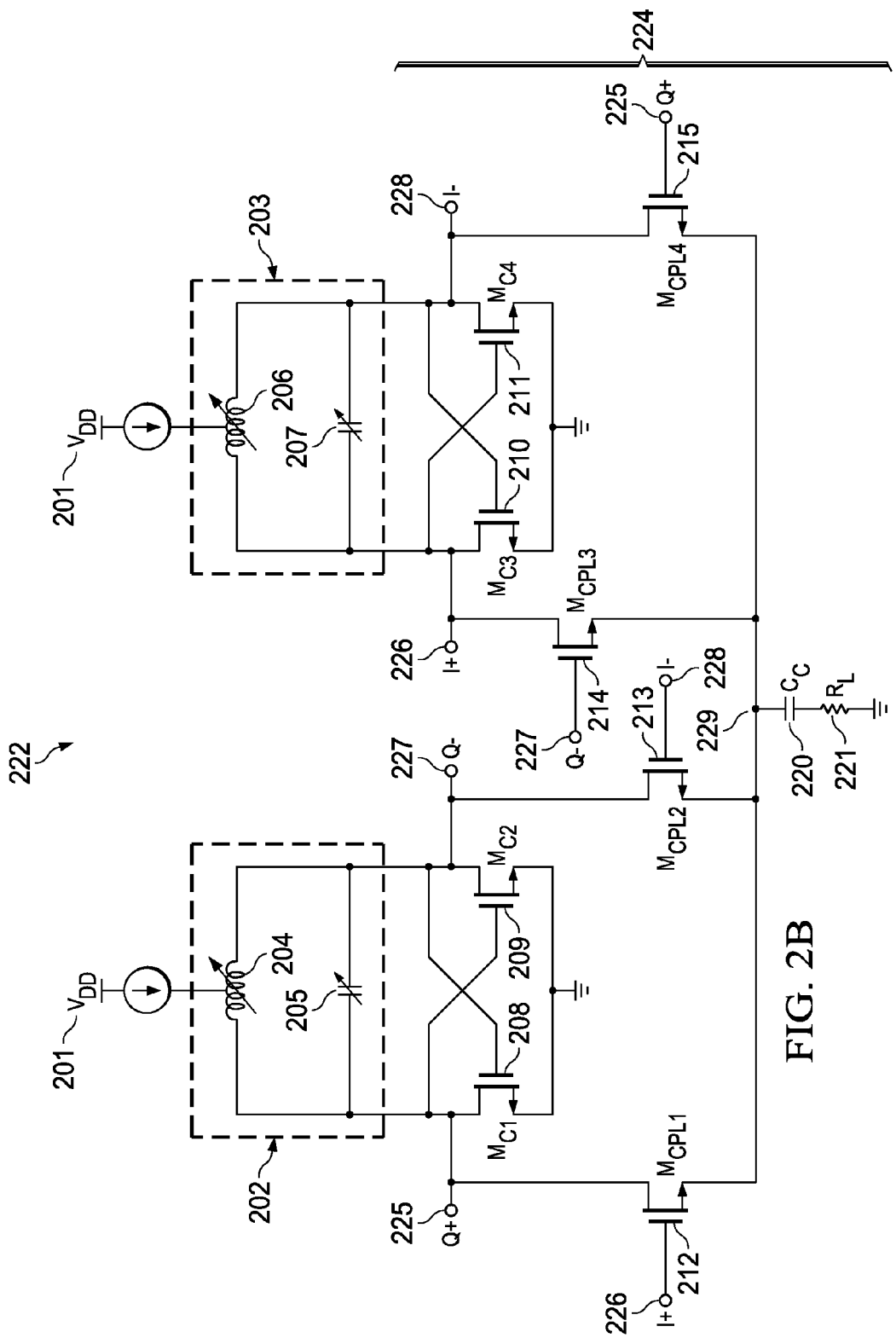
FIG. 2B is a circuit diagram of a signal generation circuit of a preferred embodiment.

Referring to FIG. 2B in another embodiment, signal generation circuit 222 eliminates source inductors ($L_{S1-4}$) 216, 217, 218, and 219. Coupling and phase combining network 224 includes transistors ($M_{CPL1-4}$) 212, 213, 214, and 215, coupling capacitor ($C_C$) 220 and load resistor ($R_L$) 221. The remainder of signal generation circuit 222 is the same as signal generation circuit 200.

Figure 3:
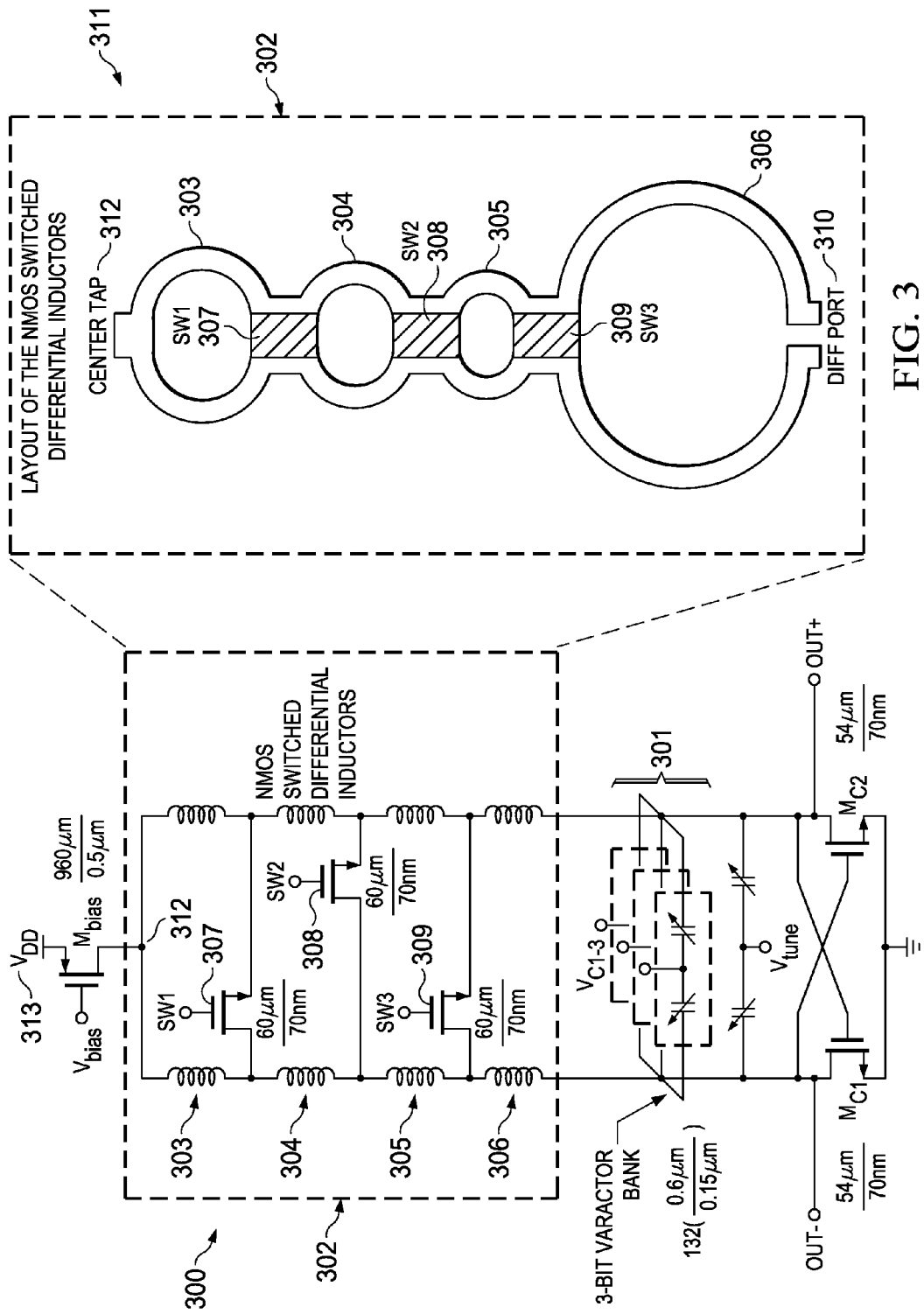
FIG. 3 is a schematic layout of a signal generation of a preferred embodiment.

Referring to FIG. 3, each of wide tuning LC tanks 202 and 203 will be further described as oscillator 300. Oscillator 300 includes a 3-bit binary-weighted accumulation-mode MOS varactor bank 301 connected to an NMOS switch-based tunable differential inductor 302 that reduces VCO gain while increasing frequency tuning. Switch-based tunable differential inductor 302 is formed by cascading four inductor sections 303, 304, 305, and 306 with three NMOS switches 307, 308, and 309 connected between two adjacent sections. Inductor section 303 is connected to center tap 312. Switch 307 is connected to inductor section 303. Inductor section 304 is connected to switch 307. Switch 308 is connected to inductor section 304. Inductor section 305 is connected to switch 308. Switch 309 is connected to inductor section 305. Inductor section 306 is connected to switch 309 and to differential port 310.

Layout 311 of the NMOS switch-based tunable differential inductor 302 is also depicted. Since the effective tank inductance looking into differential port 310 mostly relies on the self-inductance of each section rather than mutual inductance, switch-based tunable differential inductor 302 is straightforward to design and implement. Moreover, since switches 307, 308, and 309 are on differential nodes, the effective series resistance adding to the tank inductance is only half of the on-resistance of NMOS switches 307, 308, and 309, which helps to mitigate the Q degradation. The choice of the switch size for NMOS switches 307, 308, and 309 is a trade-off between tank-Q and frequency tuning range. A larger switch has smaller on-resistance, but larger parasitic capacitance. A small on-resistance helps to mitigate the inductor's Q degradation, but large parasitic capacitance will prevent the switch to be fully turned off, thus limit the frequency tuning. Each of NMOS switches 307, 308, and 309 is sized to have 5 Ω on-resistance so that the degradation of the inductor's Q is not a dominant factor of the overall tank Q degradation, while the parasitic capacitance from NMOS switches 307, 308, and 309 will not significantly affect the frequency tuning. NMOS switches 307, 308, and 309 are biased at half VDD 313 and have a small voltage swing across NMOS switches 307, 308, and 309 when turned on, so that NMOS switches 307, 308, and 309 do not need to have gate voltage over VDD 313. A 2.2 V gate voltage is applied for NMOS switches 307, 308, and 309 to ensure the switches have a minimum on-resistance in all circumstances.

The number of inductor frequency bands (N) is determined by the desired frequency tuning ratio ($f_{max}/f_{min}$) and the maximum-to-minimum tank capacitance ratio ($C_{tank\_max}/C_{tank\_mix}$). $f_{max}/$ and $C_{tank\_max}/C_{tank\_min}$ also determine the desired inductance ratio for adjacent inductor frequency bands ($L_n/L_{n+1}$). Their relationships are $$\frac{C_{tank\_max}}{C_{tank\_min}} \geq \left(\frac{f_{max}}{f_{min}}\right)^{\frac{2}{N}} = \frac{L_n}{L_{n+1}}. \qquad \text{Eq. 1}$$

Since the oscillation frequency range target was 22.5 to 37.5 GHz, and the accumulation-mode MOS varactor used has a maximum-to-minimum capacitance ratio of 3, the number of inductor frequency bands is set to 4. The minimum required $C_{tank\_max}/C_{tank\_min}$ tank capacitance is 1.3. The tank capacitance ratio and the varactor tuning ratio of 3 allows the use of a larger cross-coupled NMOS pair to provide sufficient gain for compensating the tank loss, and frequency overlap between adjacent inductor frequency bands.

By applying different settings for switches 307, 308 and 309, four different oscillator frequency bands are formed, resulting in four different effective tank inductances. The differential inductance and Q-factors in each frequency band were simulated and modeled using a 3-D EM simulator, ANSYS HFSS. Since the thickness of a top copper layer in the process is less than 1 μm, the switched differential inductor trace was implemented using an aluminum pad layer stacked with the top copper layer to increase its Q-factor. The switch settings for the different frequency bands and their simulated inductance and Q-factors, as well as the overall tank Q are summarized in Table 1 below.

TABLE 1

INDUCTOR BAND SETTINGS, SIMULATED INDUCTANCE AND Q-FACTORS

| Band | Differential Inductor Switch Setting | | | Simulated Diff. Ind. (pH) | Simulated Inductor's Q-factor (Stacked M7 and ALCAP) | Simulated Inductor's Q-factor (M7 only) | Simulated Tank's lowest Q-factor |
| --- | --- | --- | --- | --- | --- | --- | --- |
| | Switch 307 | Switch 308 | Switch 309 | | | | |
| Band1 | Off | Off | Off | 300 | 8.8 @ 23 GHz | 7 @ 23 GHz | 5 @ 23 GHz |
| Band2 | On | Off | Off | 233 | 8.6 @ 27 GHz | 7.2 @ 27 GHz | 4 @ 27 GHz |
| Band3 | On | On | Off | 181 | 9.7 @ 32 GHz | 8.3 @ 32 GHz | 3.5 @ 32 GHz |
| Band4 | On | On | On | 140 | 10.3 @ 36 GHz | 8.9 @ 36 GHz | 3.3 @ 36 GHz |

An inductor without switches has Q-factor of 15. With switches, the inductor's effective Q-factor degrades to about 9 to 10. The effective Q-factor of the switched inductor is approximately flat over the frequency bands. This is due to the Q-factor of the inductor is higher at higher frequency and the switch resistance accounts for a bigger portion of the overall series resistance for higher frequency band. The overall tank Q is about 3.3 to 5. The dominant factor for the tank-Q degradation at higher frequency band is from varactor bank 301.

Coupling and phase combining networks 223 and 224 provide mutual injection locking paths between tanks 202 and 203, and tanks 202 and 203 to run in quadrature phases, similar to that in conventional transistor-coupled quadrature VCO's. However, coupling and phase combining networks 223 and 224 do not require DC power. This not only reduces the power consumption but also reduces phase noise, because the coupling transistors with zero bias contribute the minimum noise to the oscillator tanks. More importantly, this passive combining eliminates the need for a broadband bias tee.

Figure 4:
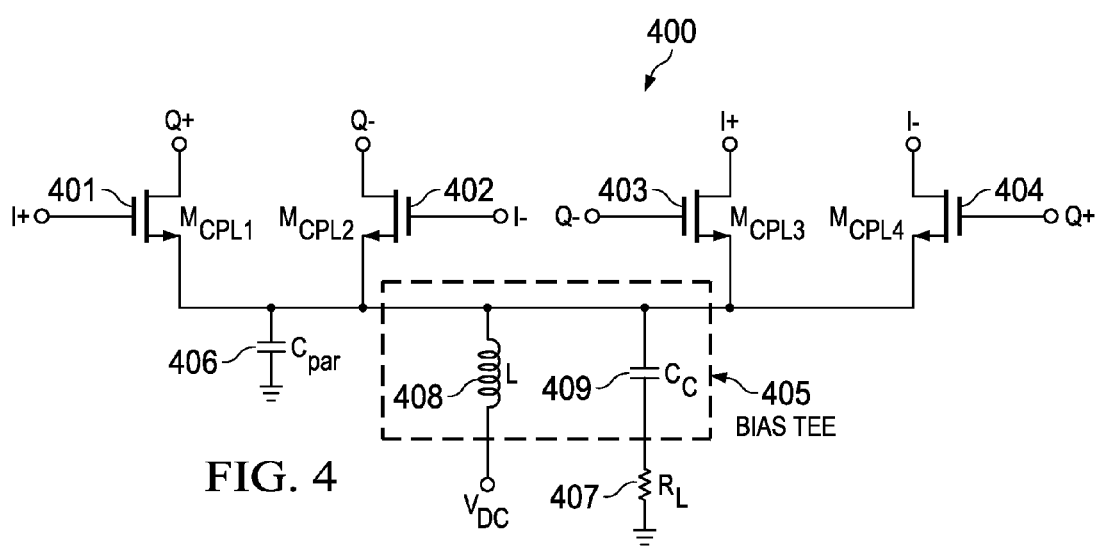
FIG. 4 is a circuit diagram of a phase combining network of a preferred embodiment and a bias tee.

Referring to FIG. 4, combining network 400 includes transistors ($M_{CPL1-4}$) 401, 402, 403, and 404, bias tee 405, and load resistance ($R_L$) 407. Bias tee 405 has inductance (L) 408 and coupling capacitance ($C_C$) 409. In this example, inductance (L) 408 needs to be at least 1 nH to provide impedance of 600 ohms at 100 GHz and should be low loss. The bias tee inductance (L) 408 and the parasitic capacitance ($C_{par}$) 406 associated with the combining node form an LC tank that limits the signal bandwidth and increases the frequency dependence of output power. Therefore, it is highly desirable to not use on-chip bias tee 405. Coupling and phase combining networks 223 and 224 simply and completely bypass this problem.

In a preferred embodiment, coupling and phase combining network 223 is considered as a passive quadrature-phase sub-harmonic mixer that performs 4× frequency multiplication.

Figure 5A:
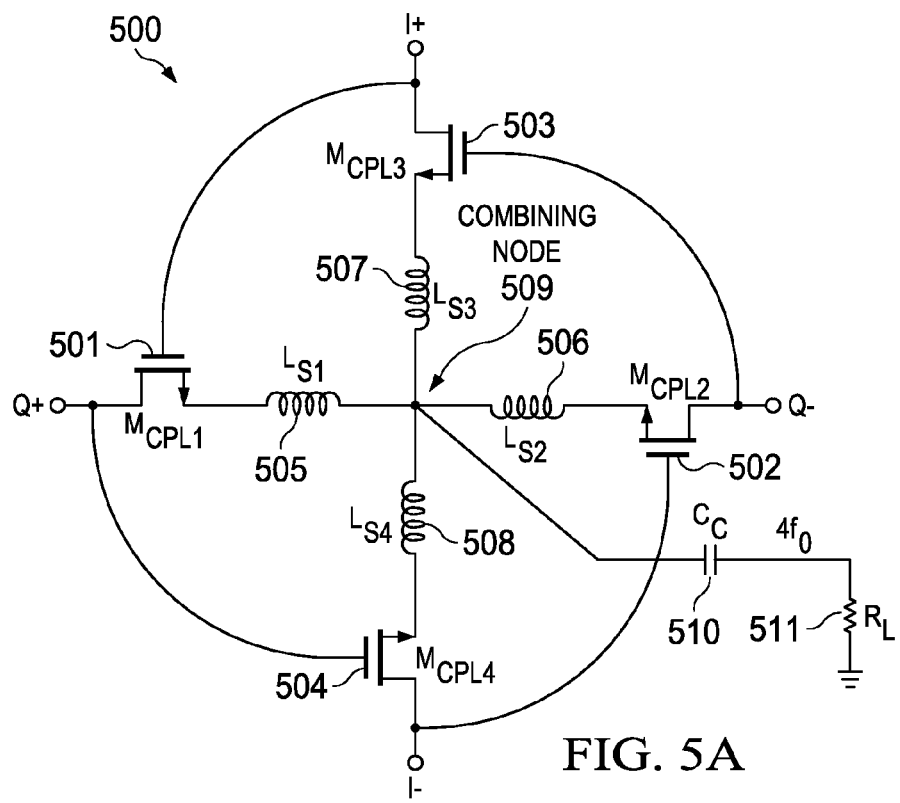
FIG. 5A is a circuit diagram of a quadrature coupling and phase combining network of a preferred embodiment.

Referring to FIG. 5A, coupling and phase combining network 223 is redrawn as network 500 to simplify and show the mixing effect. Network 500 includes coupling transistors ($M_{CPL1-4}$) 501, 502, 503, and 504, source inductors ($L_{S1-4}$) 505, 506, 507, and 508 connected at coupling node 509, coupling capacitance ($C_C$) 510 and load resistance ($R_L$) 511.

Figure 5B:
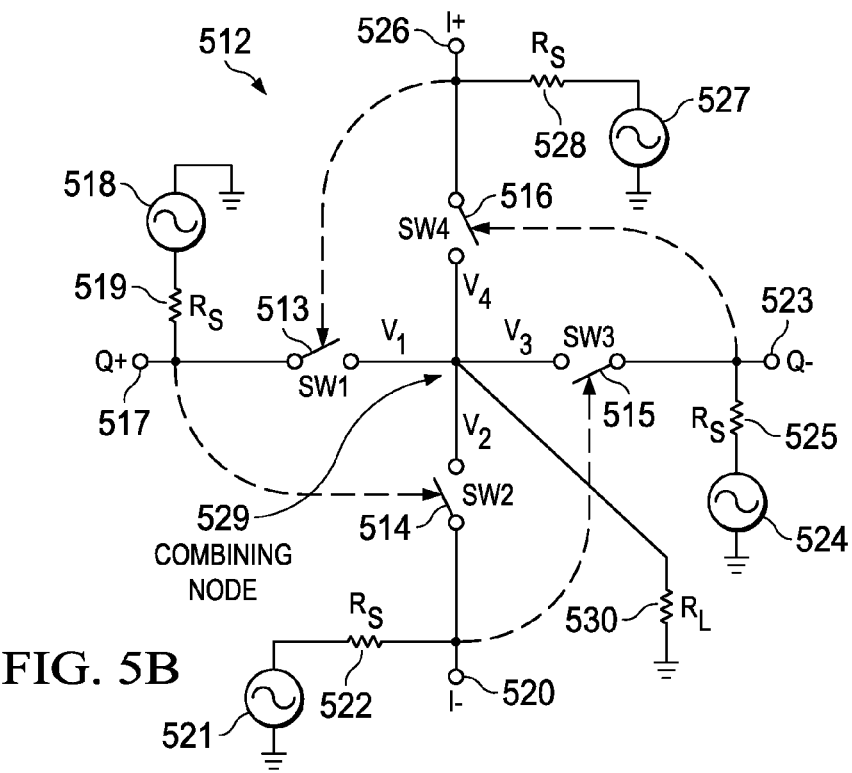
FIG. 5B is a simplified circuit diagram of a quadrature coupling and phase combining network of a preferred embodiment.

Referring to FIG. 5B, network 500 is further simplified and redrawn as network 512 where coupling transistors ($M_{CPL1-4}$) 501, 502, 503, and 504 are replaced by ideal switches ($SW_{1-4}$) 513, 514, 515, and 516. An ideal switch turns on when the switch control voltage is larger than zero, and it also has zero on-resistance and infinite off-resistance. Source inductors ($L_{S1-4}$) 505, 506, 507, and 508 are removed. The four input ports Q+, I−, Q−, and I+ are driven by four voltage sources, each with source resistance of $R_S$ and network 512 delivers power to load resistance ($R_L$) 530 on combining node 529. Input port (Q+) 517 is driven by voltage source 518 with source resistance ($R_S$) 519. Input port (I−) 520 is driven by voltage source 521 with source resistance ($R_S$) 522. Input port (Q−) 523 is driven by voltage source 524 with source resistance ($R_S$) 525. Input port (I+) 526 is driven by voltage source 527 with source resistance ($R_S$) 528.

Assuming voltage sources 518, 521, 524, and 527 have signal amplitude of A at frequency ω with quadrature phases, i.e., $$\begin{cases} V_{Q+} : A \cdot \sin(\omega t) \\ V_{Q-} : A \cdot \sin(\omega t - \pi) \\ V_{I+} : A \cdot \sin\left(\omega t - \frac{3\pi}{2}\right), \\ V_{I-} : A \cdot \sin\left(\omega t - \frac{\pi}{2}\right) \end{cases} \quad \text{Eq. 2}$$

The output voltage waveforms of each of switches ($SW_{1-4}$) 513, 514, 515, and 516 will be a product of a sine wave and a square wave, from 0 to 1, with a quadrature phase relative to the sine wave. By using the Fourier series representation of square wave, the output of switches ($SW_{1-4}$) 513, 514, 515, and 516 can be expressed as $$\begin{cases} V_1 = A \cdot \sin(\omega t)\left[\frac{1}{2} + \frac{2}{\pi}\sum_{n=1}^{\infty}\frac{1}{2n-1}\sin\left((2n-1)\left(\omega t - \frac{\pi}{2}\right)\right)\right] \\ V_2 = A \cdot \sin\left(\omega t - \frac{\pi}{2}\right)\left[\frac{1}{2} + \frac{2}{\pi}\sum_{n=1}^{\infty}\frac{1}{2n-1}\sin((2n-1)(\omega t - \pi))\right] \\ V_3 = A \cdot \sin(\omega t - \pi)\left[\frac{1}{2} + \frac{2}{\pi}\sum_{n=1}^{\infty}\frac{1}{2n-1}\sin\left((2n-1)\left(\omega t - \frac{3\pi}{2}\right)\right)\right] \\ V_4 = A \cdot \sin\left(\omega t - \frac{3\pi}{2}\right)\left[\frac{1}{2} + \frac{2}{\pi}\sum_{n=1}^{\infty}\frac{1}{2n-1}\sin((2n-1)(\omega t))\right] \end{cases} \quad \text{Eq. 3}$$

Because at any given time, two of switches ($SW_{1-4}$) 513, 514, 515, and 516 are simultaneously turned on, the overall voltage at combining node 529 will be the summation of the voltages from the two voltage sources turned on multiplied by a coefficient $R_L/(2R_L+R_S)$, and the total output voltage on combining node 529 is the sum of outputs of these four switches multiplied by the same coefficient:

$$\begin{aligned} V &= \frac{R_L}{2R_L + R_S}(V_1 + V_2 + V_3 + V_4) \\ &= -\frac{32R_L}{2R_L + R_S} \cdot A \cdot \sum_{n=1}^{\infty}\frac{n \cdot \cos\left(4n\omega t + \frac{\pi}{2}\right)}{(4n-1)(4n+1)\pi} \\ &= -\frac{32R_L}{15\pi(2R_L + R_S)}A\cos\left(4\omega t + \frac{\pi}{2}\right) - \frac{64R_L}{63\pi(2R_L + R_S)} \\ &\quad A\cos\left(8\omega t + \frac{\pi}{2}\right) - \dots. \end{aligned} \quad \text{Eq. 4}$$

Eq. 4 shows that, after phase combining, all harmonics except 4n-th order (n=1, 2, 3, . . . ) are cancelled. The 4th harmonic power delivered to the load will be $$P_{4^{th}harmonic} = \left(\frac{R_L}{2R_L + R_S}\right)^2 \left(\frac{16\sqrt{2}}{15\pi}\right)^2 \left(\frac{A^2}{R_L}\right). \quad \text{Eq. 5}$$

This power is maximized when $R_L = R_S/2$, $$P_{4^{th}harmonic,max} = \left(\frac{16\sqrt{2}}{15\pi}\right)^2 \times \left(\frac{A^2}{8R_S}\right). \quad \text{Eq. 6}$$

The total available fundamental power from the four signal sources can be derived as, $$P_{av,fund.} = 4 \times \frac{V_{in,rms}^2}{4R_S} = \left(\frac{A^2}{2R_S}\right). \quad \text{Eq. 7}$$

From Eq. 6 and Eq. 7, the theoretical maximum fundamental-to-4th order harmonic power conversion efficiency can be derived as Power Conversion Efficiency =

$$\frac{P_{4^{th}harmonic,max}}{P_{av,fund.}} = \left(\frac{8\sqrt{2}}{15\pi}\right)^2 = 5.76\%. \quad \text{Eq. 8}$$

The minimum fundamental-to-4th order harmonic power conversion loss is $$-10\log\left(\frac{8\sqrt{2}}{15\pi}\right)^2 = 12.4 \text{ dB}. \quad \text{Eq. 9}$$

This conversion loss is 3 dB lower than that resulting from the linear superposition technique.

Figure 6:
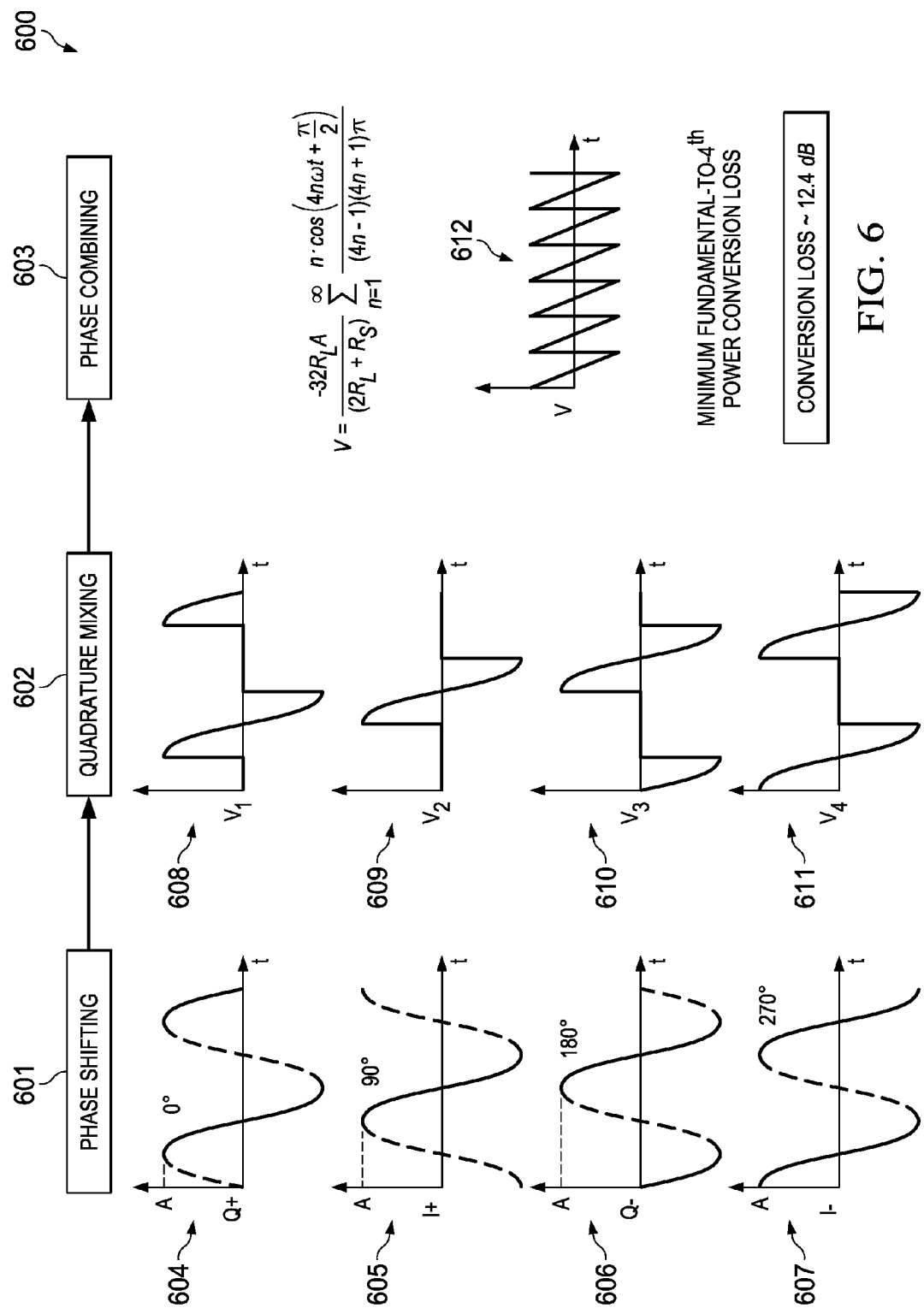
FIG. 6 is a flowchart of a method for quadrature mixing for frequency multiplication.

Referring to FIG. 6, method 600 for 4× frequency multiplication is described. In step 601, a set of input voltages defined by Eq. 1 and plotted in graphs 604, 605, 606, and 607, is injected into the signal generation circuit in a phase shifting step. As can be seen, graph 604 is shifted 90° with respect to graph 607. Graph 605 is shifted 90° with respect to graph 604. Graph 606 is shifted 90° with respect to graph 605. Graph 607 is shifted 90° with respect to graph 606. In step 602, each of the set of input voltages is mixed with a square wave resulting in a set of mixed voltages defined by Eq. 3 and plotted in graphs 608, 609, 610, and 611. In step 603, the set of mixed voltages are combined and multiplied by a coefficient $$-\frac{32R_L}{2R_L + R_S}.$$

A in a phase combining step resulting in a combined voltage delivered to a load having a 4th order harmonic frequency.

Figure 7:
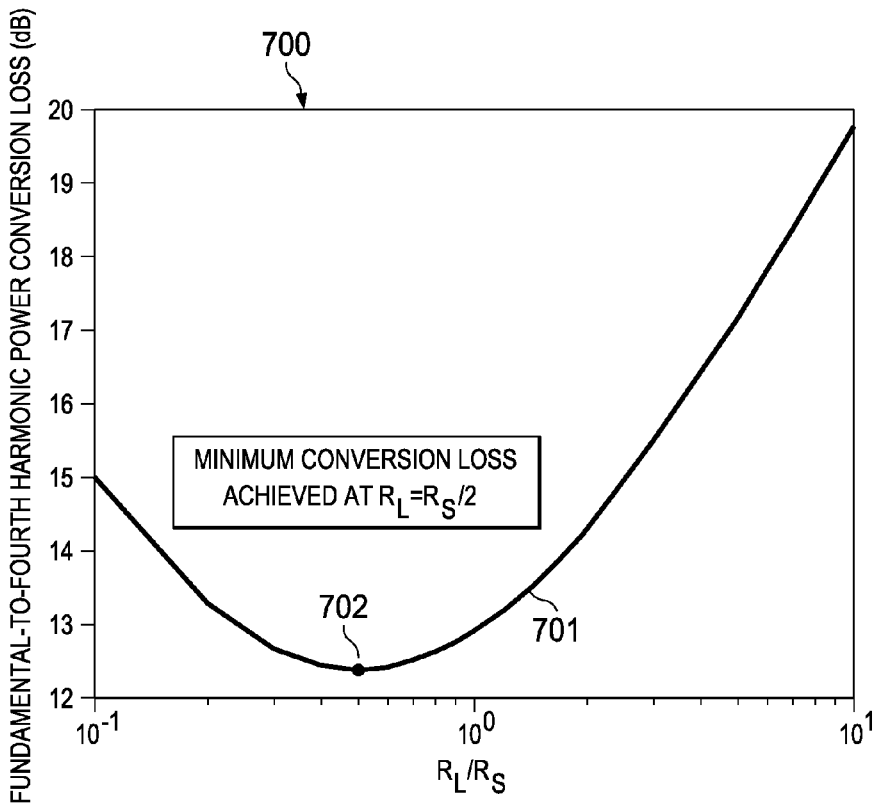
FIG. 7 is a graph of fundamental to fourth harmonic power conversion loss versus $R_L/R_S$.

Referring to FIG. 7, graph 700 includes curve 701. Curve 701 plots the fundamental-to-4th order harmonic power conversion loss as a function of $R_L/R_S$. As shown by curve 701, the conversion loss is minimized at point 702 when $R_L=R_S/2$.

Figure 8:
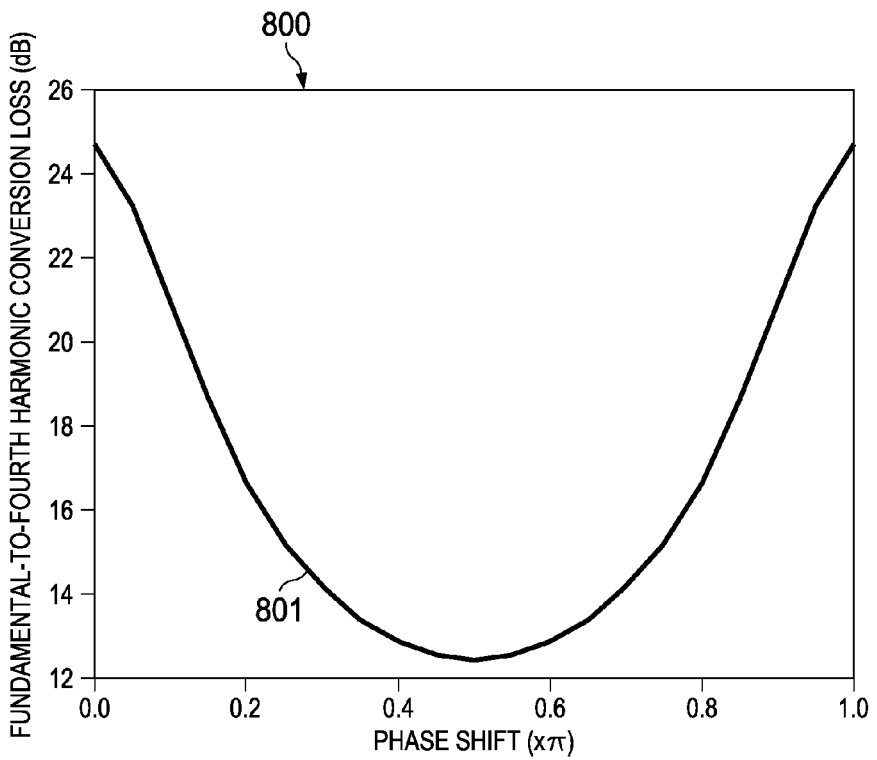
FIG. 8 is a graph of fundamental to fourth harmonic power conversion loss versus phase shift between the drain and gate voltages of a switch.

Referring to FIG. 8, graph 800 includes curve 801. Curve 801 plots the fundamental-to-4th conversion loss versus the phase shift between the input sine wave and the switch control voltage. Curve 801 suggests that the quadrature phase relationship between the input sine wave and the switch control voltage is the optimal for minimization of conversion loss.

Figure 9:
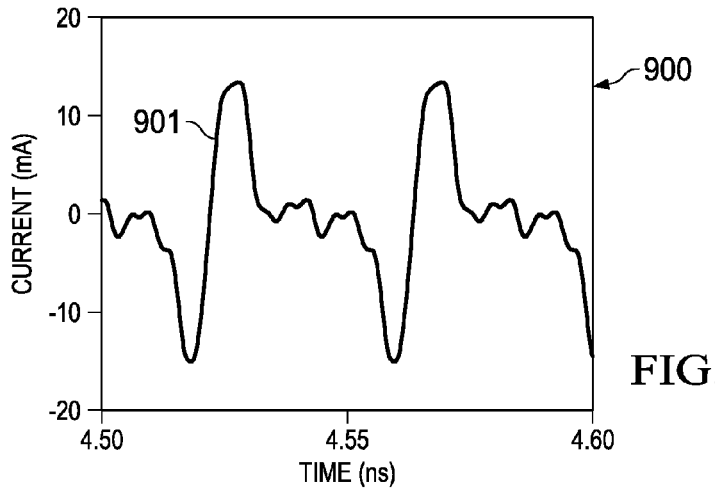
FIG. 9 is a graph of a simulated waveform of a source current through a coupling transistor of a preferred embodiment.

Referring to FIG. 9, graph 900 includes simulated waveform 901 of source current flowing through one of the coupling transistors. Simulated waveform 901 contains a rich set of harmonics due to the nonlinear operation of coupling transistors. After phase combining, all harmonics other than 4n-th orders (n=1, 2, 3 . . . ) are cancelled.

Figure 10:
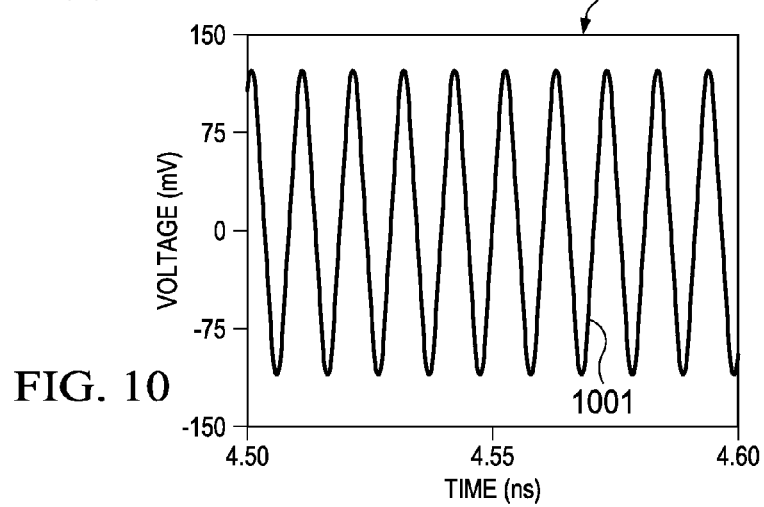
FIG. 10 is a graph of a simulated voltage waveform at a combining node of a preferred embodiment.

Referring to FIG. 10, curve 1001 of graph 1000 plots the 4th order harmonic frequency. Only the signal at the 4th order harmonic frequency is present at the output because the 8th and higher order harmonics are attenuated by the frequency response of the combining network.

Although the tank voltage goes from 0 to VDD, the combining node is self-biased at half VDD and the voltage swing of the combining node is much smaller due to the phase combining. Therefore, the gate voltages of the coupling transistors ($M_{CPL1-4}$) do not have to be higher than VDD to turn on, and additional AC coupling capacitors and a bias network are not necessary. The combining node is a virtual ground to the fundamental signals in the tank, thus the load resistor $R_L$ not degrade the tank Q.

Figure 11:
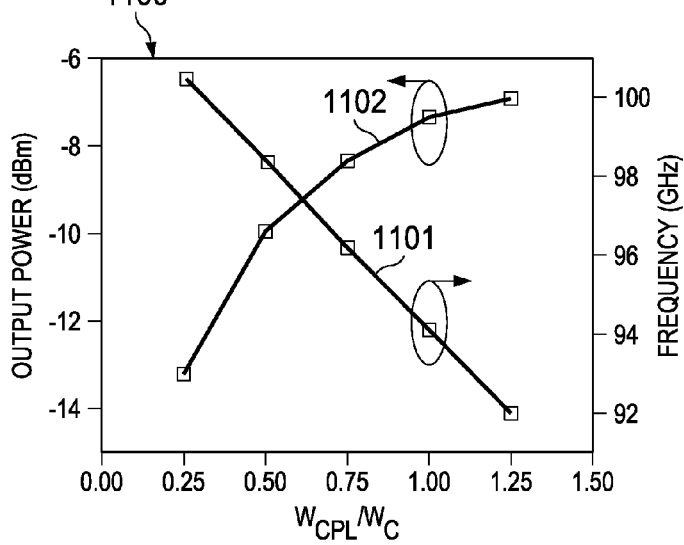
FIG. 11 is a graph of a simulated output frequency and power versus $W_{CPL}/W_C$.

Referring to FIG. 11, graph 1100 includes simulated output power 1101 and output frequency 1102 versus width ratio ($W_{CPL}/W_C$). As shown, the size choice of the coupling transistor results in a trade-off between oscillation frequency and output power. This is due to the fact that a larger size coupling transistor gives lower on-resistance but more parasitic capacitance. The width ratio of each of coupling transistors 212, 213, 214, and 215 to each of core transistors 208, 209, 210, and 211 ($W_{CPL}/W_C$) of 0.75 was selected in signal generation circuit 200. Source inductors ($L_S$) 216, 217, 218, and 219 were added to coupling and phase combining network 223. The primary purpose of adding source inductors ($L_S$) 216, 217, 218, and 219 is to resonate out the parasitic capacitance at 4th harmonic on the combining node, and to increase the nonlinearity in the switch operation, so that more power can be generated and delivered to the load at 4th harmonic frequency. This increases the combined 4th-order harmonic power. Moreover, source inductors 216, 217, 218, and 219 change the phase of the injected current in such a way that it is now partially in-phase with the tank voltage.

Figure 12A:
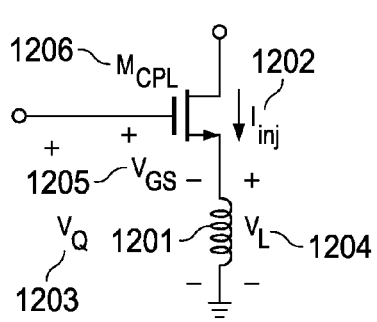
FIG. 12A is a schematic of an injection current phase optimization of a preferred embodiment.
Figure 12B:
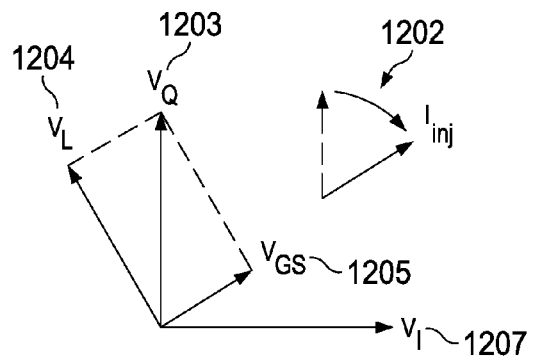
FIG. 12B is a phasor diagram of an injection current phase optimization of a preferred embodiment.

Referring to FIGS. 12A and 12B by way of example, source inductor 1201 changes the phase of injected current ($L_{inj}$) 1202. Voltage ($V_Q$) 1203 is the Q-tank voltage and voltage ($V_L$) 1204 is the voltage across source inductor 1201. Voltage ($V_{GS}$) 1205 is the gate-to-source voltage of the core transistor ($M_{CPL}$) 1206. Without the source inductor 1201, the injection current ($I_{inj}$) 1202 will be in-phase with the Q-tank voltage ($V_Q$) 1203, thus 90 degrees out-of-phase with the I-tank voltage ($V_I$) 1207. This orthogonal injection forces the oscillation frequency to deviate from the tank resonant frequency, thus degrading the phase noise. After adding the source inductor 1201, the phasor of the injection current ($I_{inj}$) 1202 shifts toward the phasor of the of the I-tank voltage ($V_I$) 1207. This results in a component of injection current that is in-phase with the tank voltage, which helps to decouple the tradeoff between quadrature phase accuracy and phase noise, thus reducing phase noise.

Figure 13:
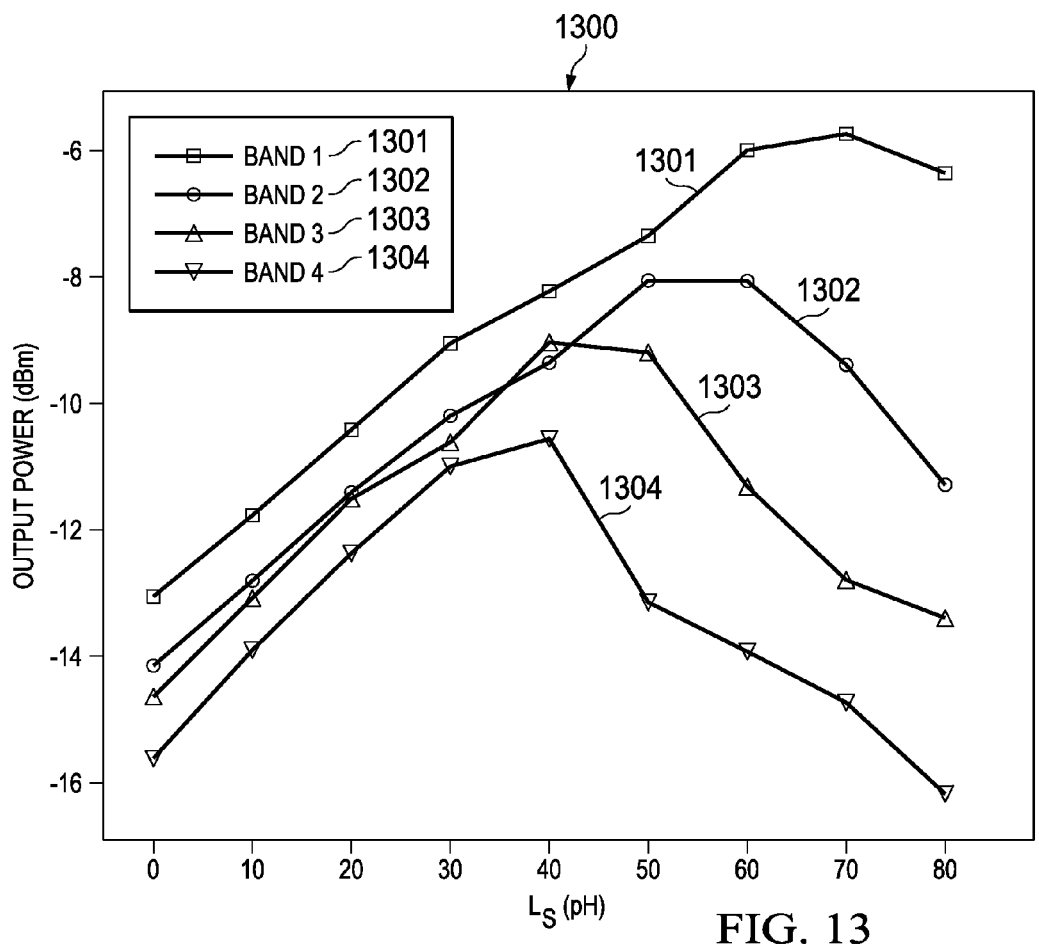
FIG. 13 is a graph of a simulated output power versus $L_S$ in four inductor bands.

Referring to FIG. 13, graph 1300 shows the simulated output power versus source inductance for each induction band. Bands 1301, 1302, 1303, and 1304 correspond to source inductors 216, 217, 218, and 219, respectively, of FIG. 2A. An optimal value of 30 pH was chosen to maximize the power in band 1304 having the lowest output power.

Simulated 4th harmonic output power delivered to a 50-Ω load resistance is about −10 dBm. This in conjunction with the assumption that the VCO has source resistance of 40-Ω (estimated from the load-pull simulation) and fundamental signal swing of 1 V results in a power conversion loss of 15 dB. Compared with the analytical conversion loss of 13.3 dB under the same load condition, the discrepancy is less than 2 dB. This discrepancy is due the parasitic and the transistors' non-idealities that were not taken into account in the simplified analysis.

Although only 4n-th (n=1, 2, 3, . . . ) harmonics is generated at the combining node in principle, any amplitude or phase mismatches between the in-phase and quadrature-phase signals will cause the output power leaking into other undesired harmonics and lower the 4th harmonic conversion efficiency. With amplitude mismatch ΔA and phase mismatch ΔΦ. Eq. 3 is amended as $$\begin{cases} V_1 = A \cdot \sin(\omega t) \left[ \frac{1}{2} + \frac{2}{\pi} \sum_{n=1}^{\infty} \frac{1}{2n-1} \sin\left((2n-1)\left(\omega t - \frac{\pi}{2} - \Delta\phi\right)\right) \right] & \text{Eq. 10} \\ V_2 = (A - \Delta A) \cdot \sin\left(\omega t - \frac{\pi}{2} - \Delta\phi\right) \left[ \frac{1}{2} + \right. \\ \left. \frac{2}{\pi} \sum_{n=1}^{\infty} \frac{1}{2n-1} \sin((2n-1)(\omega t - \pi)) \right] \\ V_3 = A \cdot \sin(\omega t - \pi) \left[ \frac{1}{2} + \right. \\ \left. \frac{2}{\pi} \sum_{n=1}^{\infty} \frac{1}{2n-1} \sin\left((2n-1)\left(\omega t - \frac{3\pi}{2} - \Delta\phi\right)\right) \right] \\ V_4 = (A - \Delta A) \cdot \sin\left(\omega t - \frac{3\pi}{2} - \Delta\phi\right) \left[ \frac{1}{2} + \right. \\ \left. \frac{2}{\pi} \sum_{n=1}^{\infty} \frac{1}{2n-1} \sin((2n-1)(\omega t)) \right] \end{cases}$$

Figure 14A:
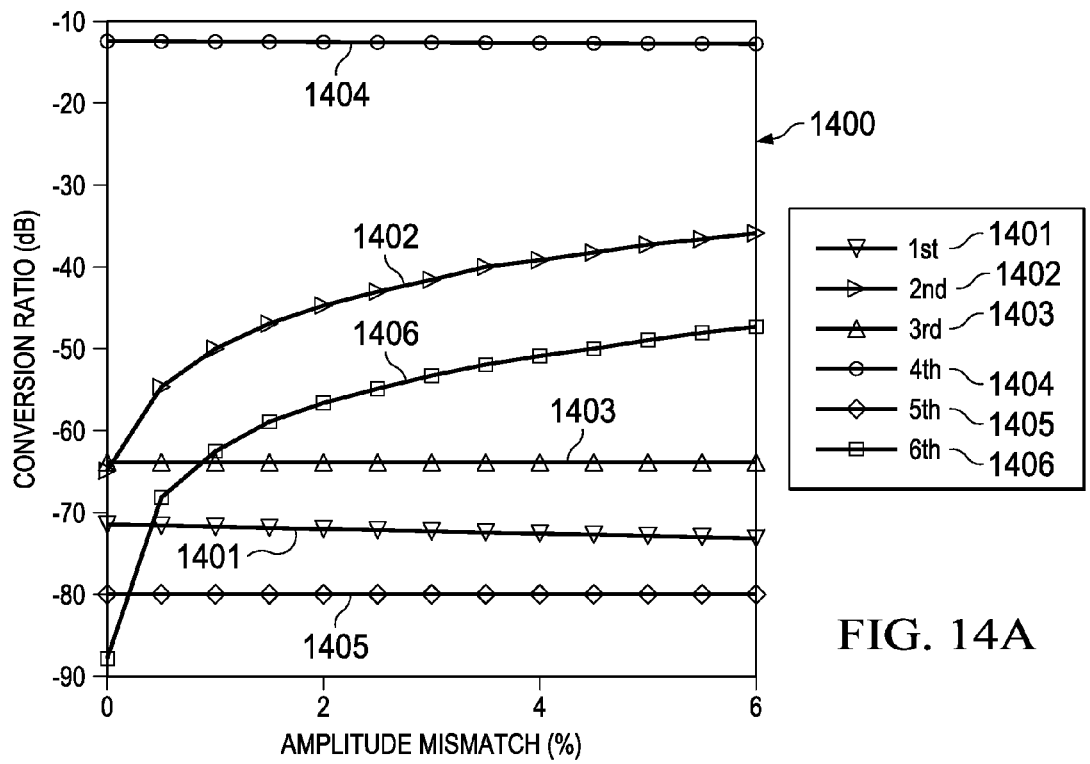
FIG. 14A is a graph of harmonic power conversion ratio versus amplitude mismatch.
Figure 14B:
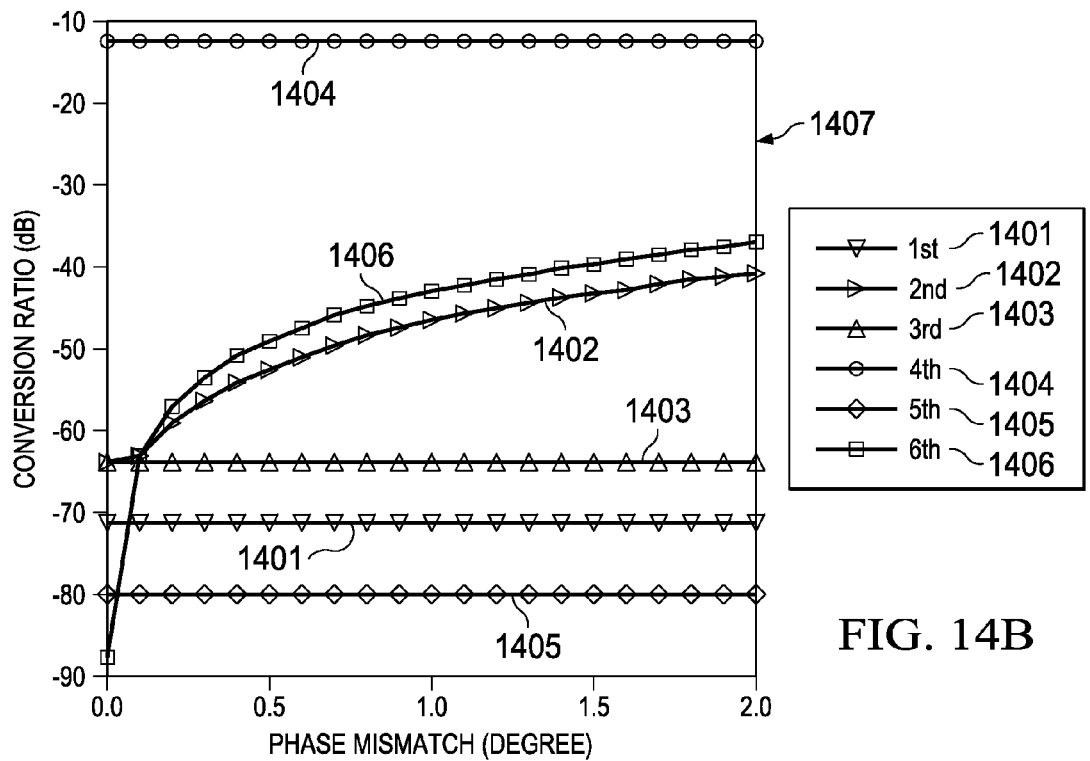
FIG. 14B is a graph of harmonic power conversion ratio versus phase mismatch.

Referring to FIGS. 14A and 14B, from Eq. 4, Eq. 6, and Eq. 10, the output harmonic power conversion ratio, defined as harmonic power delivered to the load divided by the total available fundamental power from the VCO, versus the phase and amplitude mismatches were analytically simulated. Harmonic curves 1401, 1402, 1403, 1404, 1405, and 1406 plot the first, second, third, fourth, fifth, and sixth harmonics, respectively. Harmonic curves 1402 and 1406 show that the second and sixth harmonic will be the dominant harmonic leakage terms in both scenarios where amplitude mismatch and phase mismatch are presented. The second and sixth harmonic power greatly increases with a small amplitude mismatch or phase mismatch, but will eventually saturate. Even with 6% amplitude mismatch or 2 degree phase mismatch, the second and sixth harmonic power is at least 20 dB lower than the fourth order harmonics power as shown by harmonics curve 1404. Further, harmonics curve 1404 shows that the 4th harmonic power is insensitive to I/Q mismatches over a large mismatch ranges.

Figure 15:
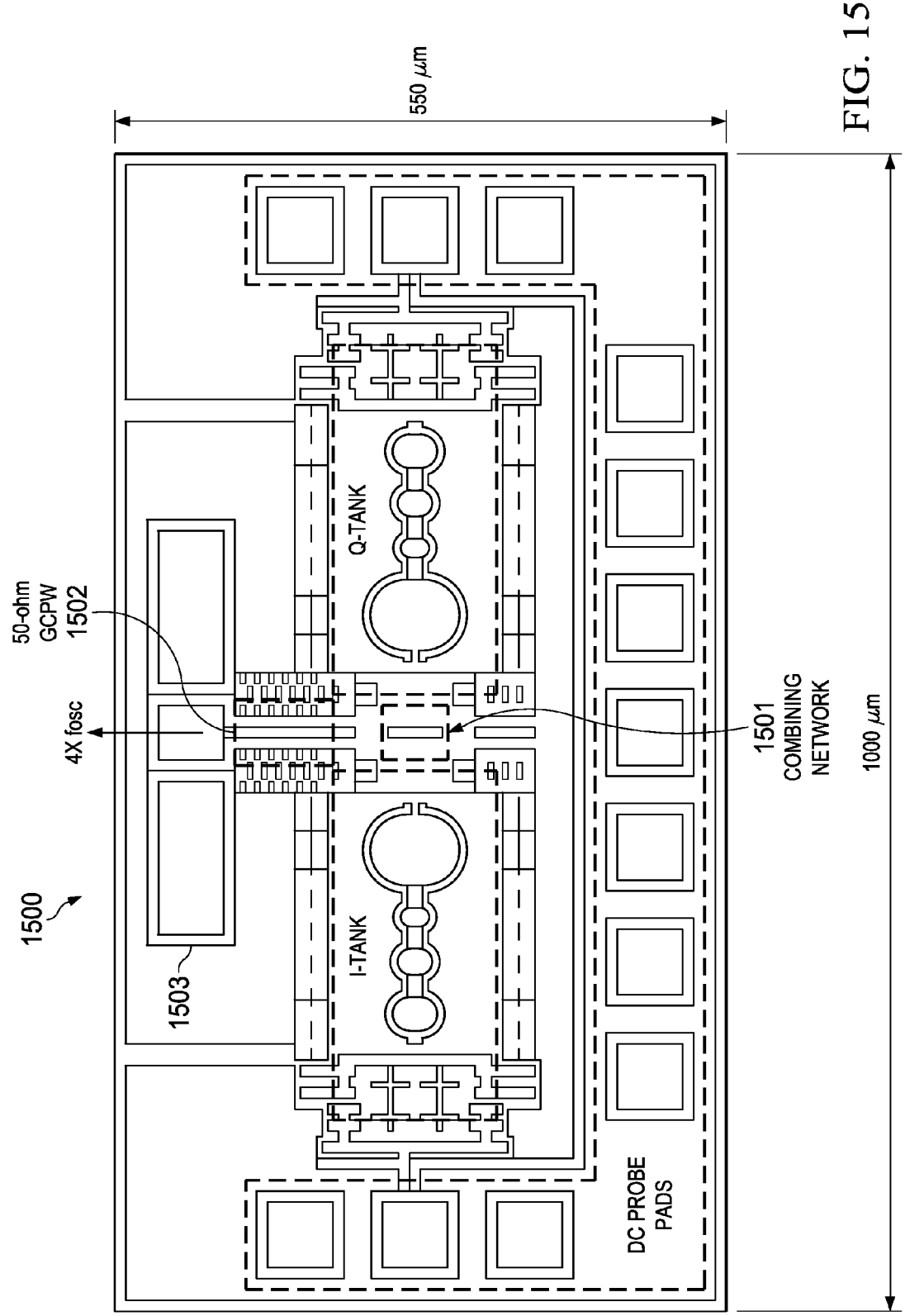
FIG. 15 is a die photograph of a signal generation circuit of a preferred embodiment.

Referring to FIG. 15, signal generation circuit 200 is implemented in 65-nm bulk CMOS. Layout 1500 is optimized for symmetry to minimize mismatches. Source inductors are implemented using only the top copper layer, as will be further described below. Stacking with the aluminum pad layer for the source inductors is not practical due to the design rule restrictions. The current from the coupling transistors is combined in combining network 1501, as will be further described below. A 50-ohm Grounded CPW (GCPW) was implemented at 1502 using the aluminum layer to route the combined signal to GSG pad 1503 for measurements. In a preferred embodiment, the overall chip size for layout 1500 is 1000 µm×550 µm, including bond pads and GSG pad 1503.

Figure 16:
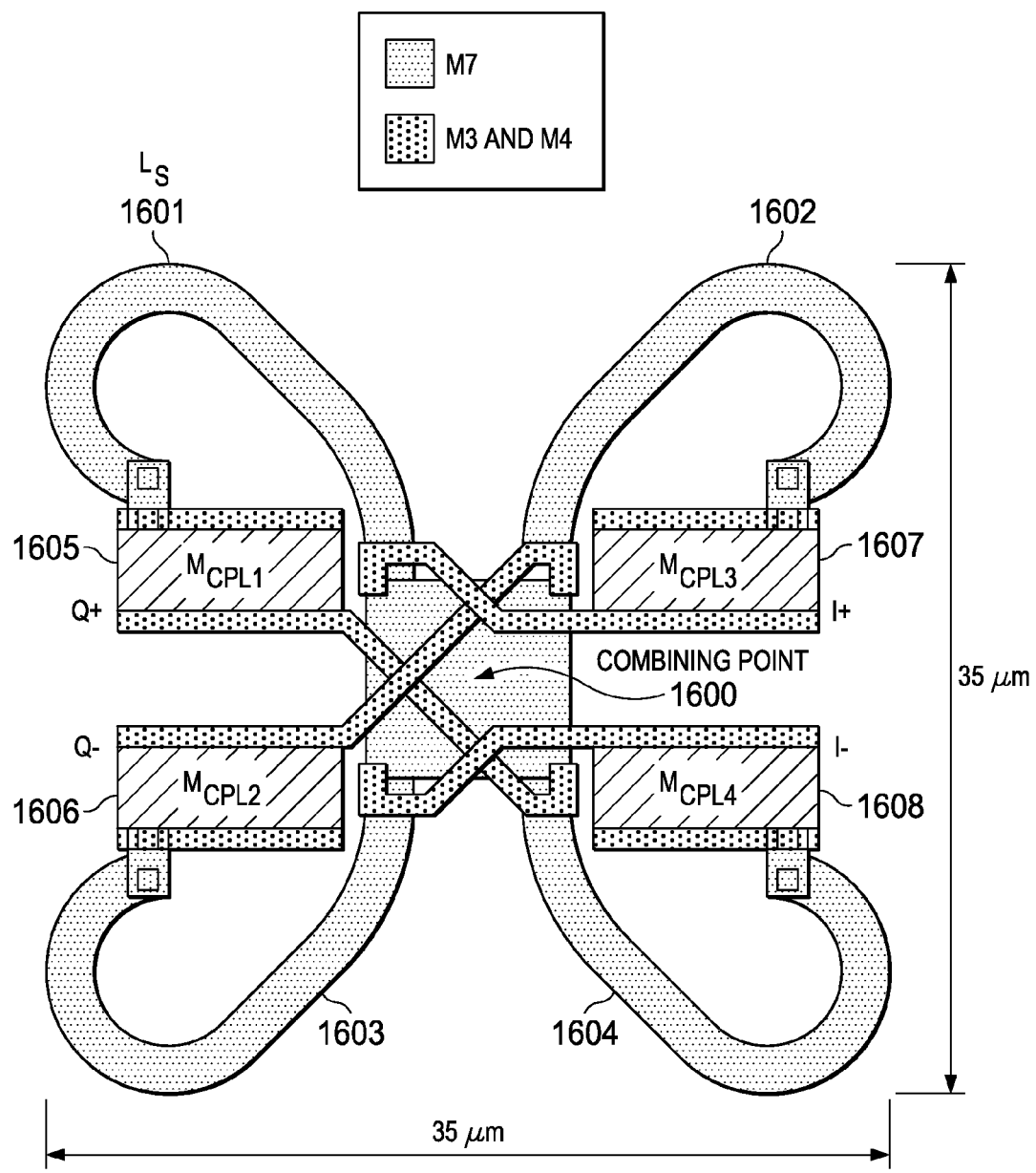
FIG. 16 is a butterfly layout of a set of source inductors of a signal generation circuit of a preferred embodiment.

Referring to FIG. 16, source inductors 1601, 1602, 1603, and 1604 have a butterfly style layout connecting to coupling transistors 1605, 1606, 1607, and 1608, allowing combining network 1600 to occupy only a relatively small area.

Figure 17:
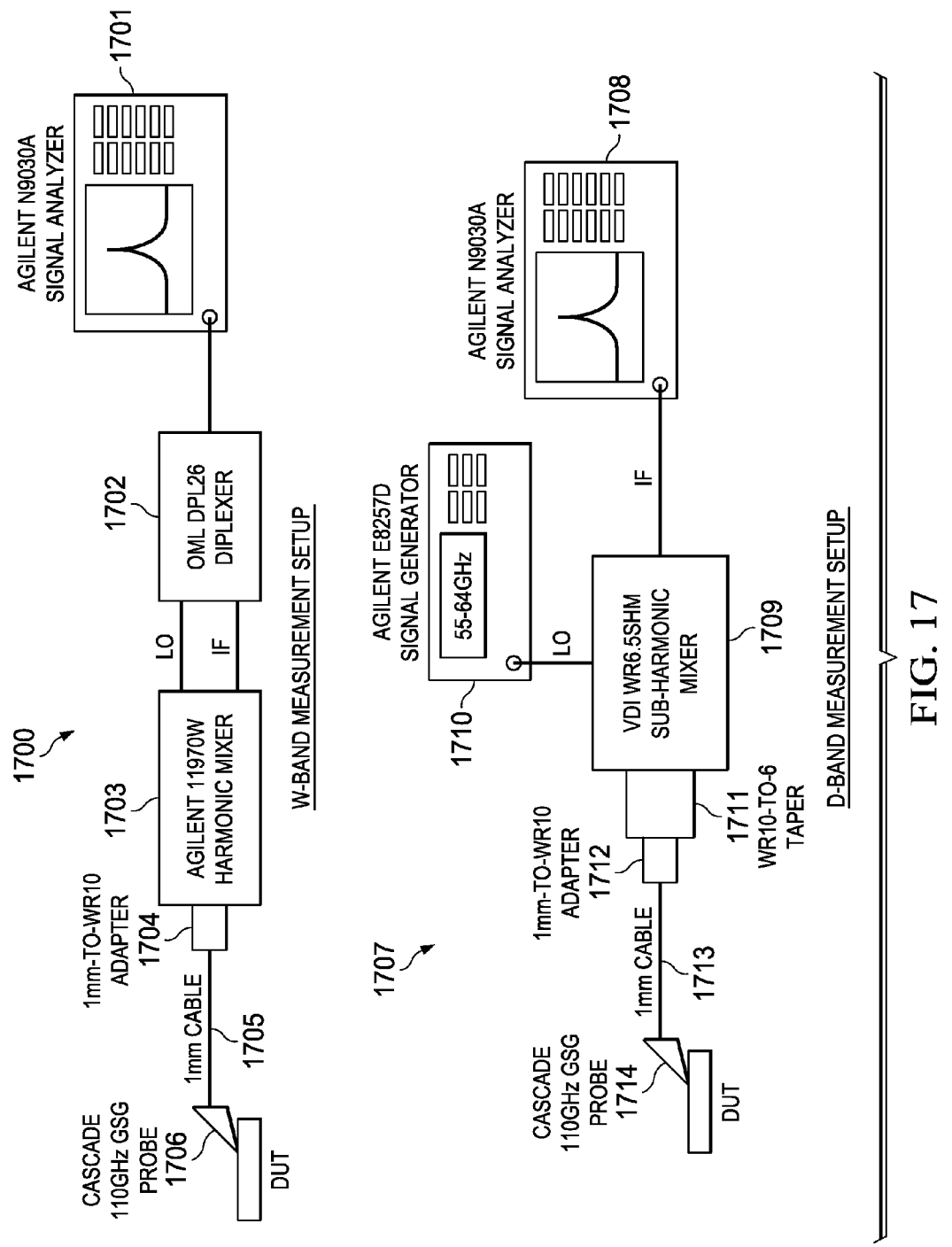
FIG. 17 is a schematic of a measurement setup of W-band and D-band.

Referring to FIG. 17, W-band measurement setup 1700 includes signal analyzer 1701 connected to diplexer 1702. Diplexer 1702 is connected to harmonic mixer 1703. Harmonic mixer 1703 has adapter 1704 and cable 1705 to connect probe 1706.

D-band measurement setup 1707 includes signal analyzer 1708 connected to sub-harmonic mixer 1709. Sub-harmonic mixer 1709 is connected to signal generator 1710. Sub-harmonic mixer 1709 has taper 1711, adapter 1712, and cable 1713 to connect probe 1714.

In a preferred embodiment, each of signal analyzers 1701 and 1708 is an Agilent N9030A PXA Signal Analyzer.

In a preferred embodiment, diplexer 1702 is an OML DPL26 Diplexer.

In a preferred embodiment, harmonic mixer 1703 is an Agilent 11970W harmonic mixer.

In a preferred embodiment, signal generator 1710 is an Agilent E8257D Signal Generator.

In a preferred embodiment, sub-harmonic mixer 1709 is a VDI WR6.5 sub-harmonic mixer.

In a preferred embodiment, a VDI WR10 Amplifier Multiplier Chain, A VDI PM4 Erickson Power Meter, an Agilent E8361A PNA, and an N5260-60003 Frequency Extension Module (not shown) were used to calibrate the power loss in the measurement setup including those for the probes, cables, adapter and mixers.

Figure 18:
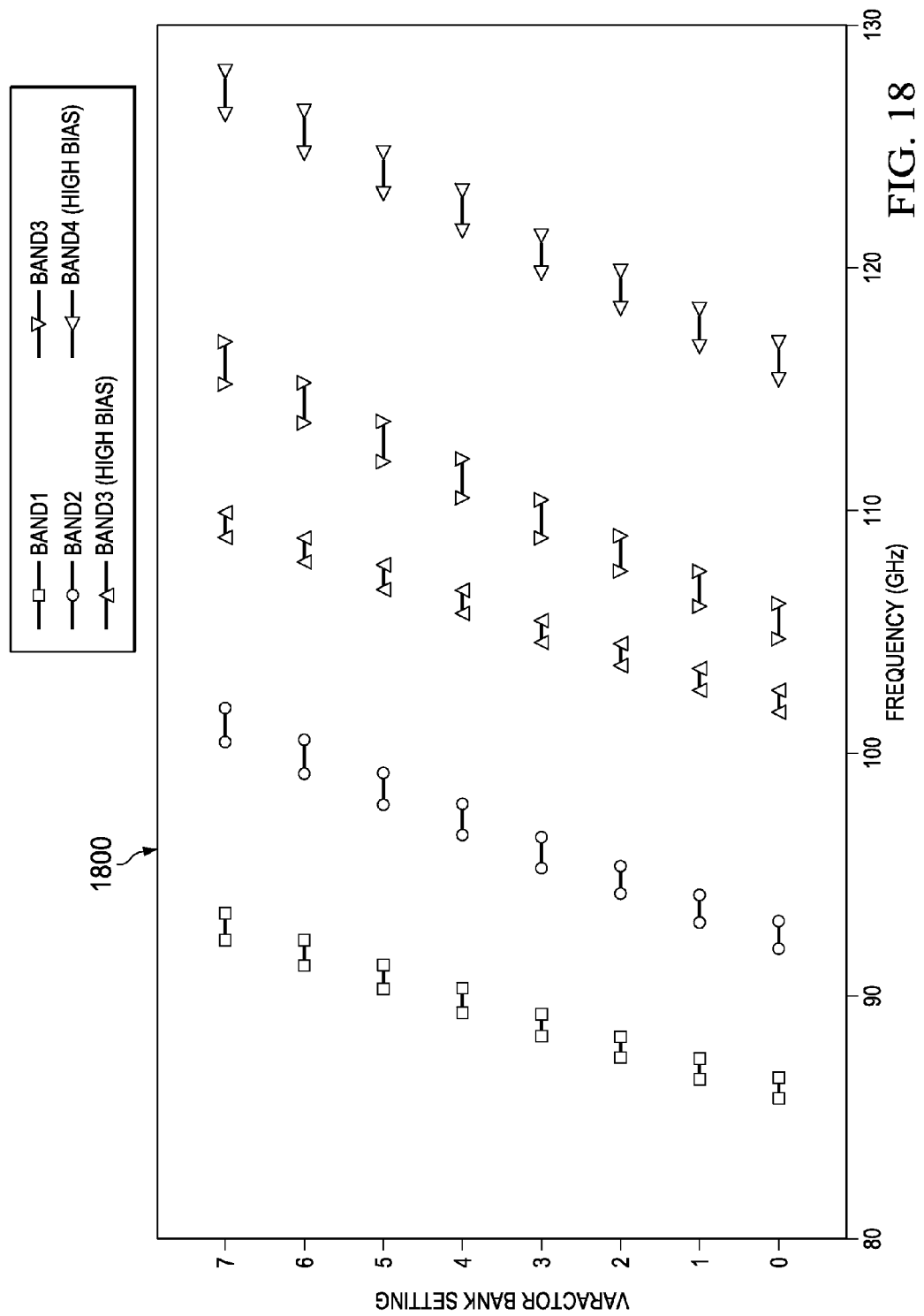
FIG. 18 is a graph of a measured frequency tuning range of a signal generation circuit of a preferred embodiment.

Referring to FIG. 18, graph 1800 plots the measured frequency tuning range for all frequency bands generated by signal generation circuit 200. The bias current for the circuit was set to be 20 mA in total except for the "Band 3 high bias" and "Band 4 high bias" cases in which the bias current was increased to 30 mA to further extend the frequency tuning as well as to increase output power and reduce phase noise. The power consumption varied between 30 and 45 mW from a 1.5-V power supply. The simulated voltages across any two terminals of transistors are less than 1.2 V. As shown, the measured signal frequency can be tuned from 85 to 127 GHz without any gaps. The corresponding tuning range is 39%, which is 4× higher than that for conventional CMOS signal generation circuits with output frequencies over 90 GHz.

Figure 19:
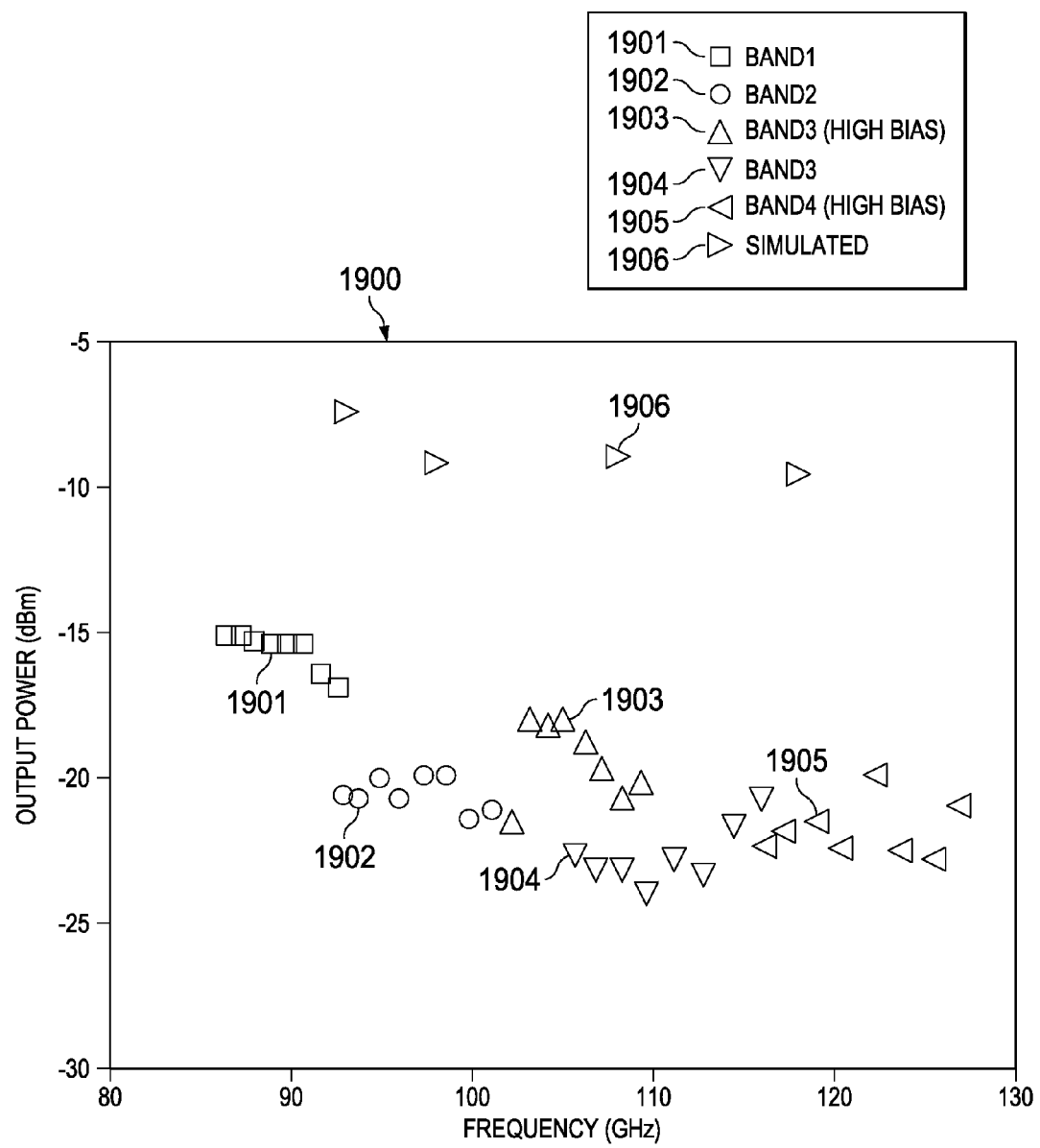
FIG. 19 is a graph of a measured and a simulated output power across all frequencies.

Referring to FIG. 19, graph 1900 plots the measured signal output power of signal generation circuit 200 after de-embedding the losses of the measurement setup in frequency bands 1901, 1902, 1903, 1904, and 1905, and simulated output power 1906. The power calibration has 1-2 dB of uncertainties. The measured signal power on bands 1901, 1902, 1903, 1904, and 1905 is between −15 and −23 dBm over the output frequency range. Simulated output power 1906 across all frequency bands is −7 to −9.5 dBm. The difference between the measured output power on bands 1901, 1902, 1903, 1904, and 1905 and simulated output power 1906 is over 10 dB. This is due to inaccurate device models. Nevertheless, the lower-than-expected measured output power 1901, 1902, 1903, 1904, and 1905 is suitable for rotational spectroscopy in which output power of −30 dBm is used.

Figure 20:
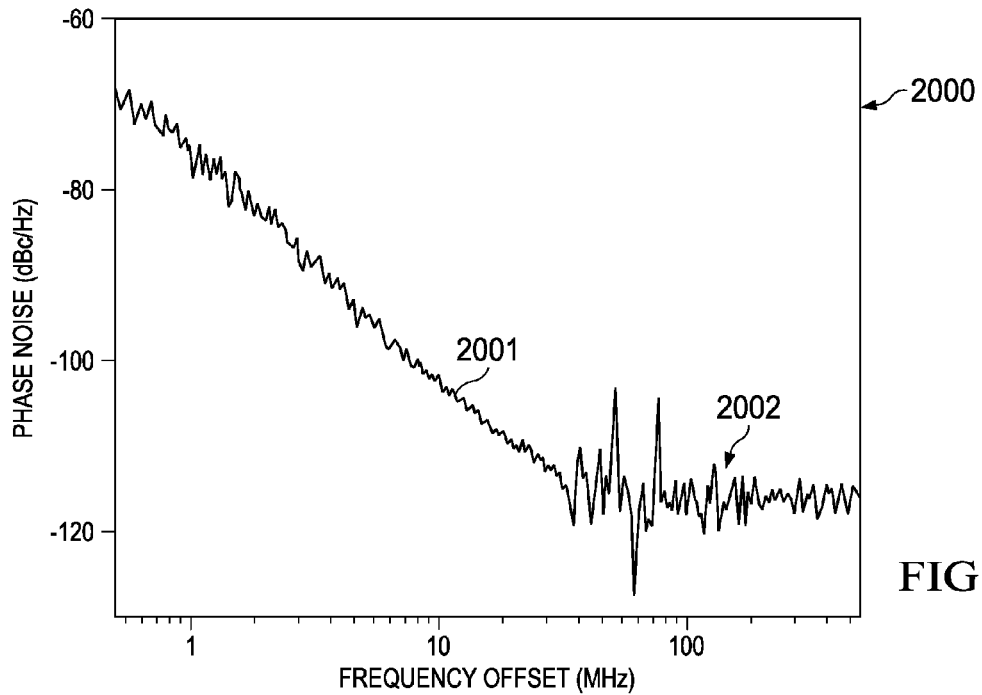
FIG. 20 is a graph of a measured phase noise plot for a 127-GHz carrier.

Referring to FIG. 20 by way of example, signal generation circuit 200 was locked in a phase-locked loop with bandwidth of 500 kHz for phase noise 2001 measured and plotted on graph 2000. Phase noise 2001 at a 10-MHz offset from a 126.9-GHz carrier (in Band 4) is significantly above instrument noise floor 2002.

Figure 21:
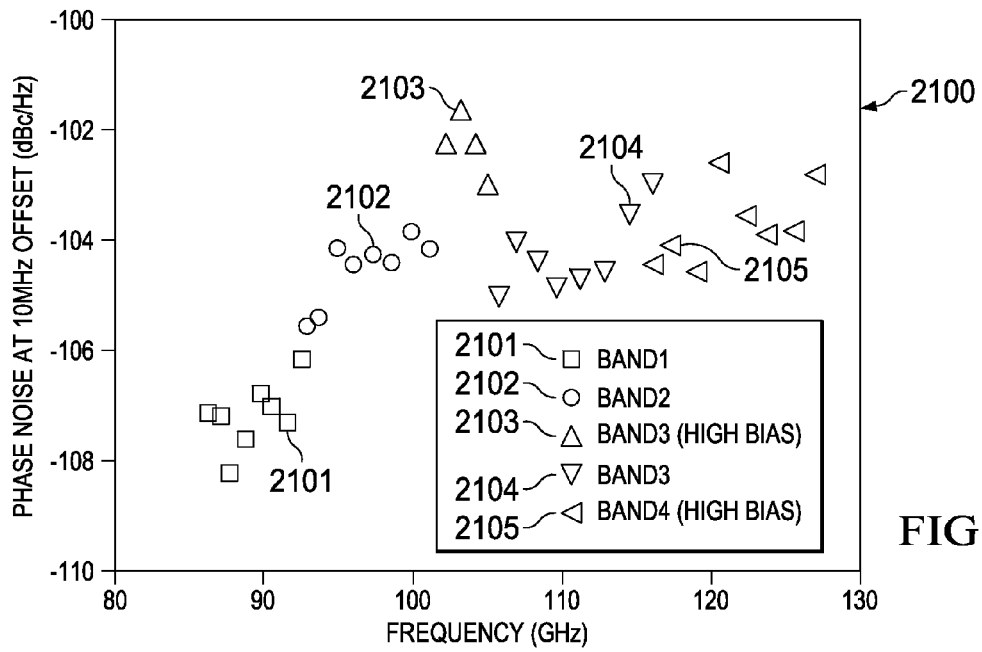
FIG. 21 is a graph of a measured phase noise at 10 MHz offset across all frequencies.

Referring to FIG. 21, measured phase noises 2101, 2102, 2103, 2104, and 2105 are plotted on graph 2100 at 10-MHz offset across all frequency bands. Measured phase noises 2101, 2102, 2103, 2104, and 2105 varies from −108 to −102 dBc/Hz at 85 to 127 GHz, which is within the rotational spectroscopy design specification of −88 dBc/Hz@10-MHz offset for a 120 GHz carrier.

Table 2 below summaries and compares the performance of six conventional CMOS millimeter wave signal generation circuits and signal generation circuit 200.

TABLE 2

Comparison of Signal Generation Circuit to Conventional Circuits

| Circuits | Circuit 1 | Circuit 2 | Circuit 3 | Circuit 4 | Circuit 5 | Circuit 6 | Circuit 200 |
|---|---|---|---|---|---|---|---|
| Technology | 65 nm CMOS | 65 nm CMOS | 32 nm SOI | 65 nm CMOS | 65 nm CMOS | 65 nm CMOS | 65 nm CMOS |
| Supply Voltage (V) | 1.2 | 1.5 | 1.2 | 1 | 0.8 | 1.2 | 1.5 |
| Center Frequency (GHz) | 289.5 | 94.6 | 102.2 | 118 | 100.9 | 73.8 | 106.7 |
| Frequency Tuning Range (%) | 4.5 | 5.8 | 4.1 | 7.8 | 11.2 | 44.2[f] | 39.4 |
| DC Power (mW) | 325[a] | 9 | 7.6 | 5.6 | 3.5 to 11.9 | 8.4 to 10.8 | 30 to 45[b] |
| PN @ 10-MHz offset[c] (dBc/Hz) | −98 | −106 | −100.8 | −103.9 | −104.5 | −104.6/ −112.2 | −101.6/ −108.2 |
| $FOM_T$[d] (dBc/Hz) | −155.2 | −171.2 | −164.6 | −175.7 | −176.5 | −184.2/ −192.2 | −179.3/ −185.9 |
| Output Power (dBm) | −1.2 | −4 to −8[e] | N/A | >−28.5 | N/A | −20 to −25 | −15 to −23 |
| PN @ 10-MHz offset at 85 to 90 GHz (dBc/Hz) | — | — | — | — | — | −105 to −106 | −107 to −108 |
| Output Power at 85 to 90 GHz (dBm) | — | — | — | — | — | less than −20 | −15 |
| Chip Area (mm²) | 0.36 | 0.24 | 0.0014 (core) | 0.22 | 0.0025 (core) | 0.03 (core) | 0.55 |

[a]4 VCO's.
[b]Q-VCO.
[c]Phase noises are reported at center frequency. Estimated from 1-MHz offset if 10-MHz offset phase noise is not reported.

[d]$FOM_T = PN - 20\log\left(\frac{f_o}{\Delta f} \times \frac{FTR}{10}\right) + 10\log\left(\frac{P_{DC}}{1 \text{ mW}}\right)$.

[e]Output buffers are used.
[f]It has frequency tuning gap.

Signal generation circuit 200 has a frequency tuning range which is more than 4× higher compared to conventional CMOS signal generation circuits with center frequency over 90 GHz, and achieves $FOM_T$ of −179 to −186 dBc/Hz which is more than 4 dB lower than that of conventional CMOS signal generation circuits. Compared with circuit 6, signal generation circuit 200 exhibits 2 dB lower phase noise and 5 dB higher output power while having the same $FOM_T$ at the same output frequencies (85 to 90 GHz) and power efficiency, and not have a frequency gap.

It will be appreciated by those skilled in the art that modifications can be made to the embodiments disclosed and remain within the inventive concept. Therefore, this invention is not limited to the specific embodiments disclosed, but is intended to cover changes within the scope and spirit of the claims.

The invention claimed is:

1. A circuit for generating a wide-tuning signal comprising:
    a set of wide tuning LC tanks;
    a set of core transistors cross coupled to the set of wide tuning LC tanks;
    a combining network, coupled to the set of wide tuning LC tanks and the set of core transistors, further comprising:
        a set of inputs connected to the set of wide tuning LC tanks and the set of core transistors;
        a set of coupling transistors connected to the set of inputs;
        a set of source inductors connected to the set of coupling transistors;
        a coupling capacitor connected to the set of source inductors;
        a load resistor connected to the coupling capacitor;
    whereby the combining network generates a set of quadrature signals from the set of inputs, combines the set of the quadrature signals into the wide-tuning signal, and the wide-tuning signal is delivered to the load resistor as a fourth order harmonic.

2. The circuit of claim 1, wherein each wide tuning LC tank of the set of wide tuning LC tanks further comprises:
    a tunable differential inductor; and,
    a varactor bank connected to the tunable differential inductor.

3. The circuit of claim 2, wherein the tunable differential inductor further comprises:
    a first inductor section;
    a first switch connected to the first inductor section;
    a second inductor section connected to the first switch;
    a second switch connected to the second inductor section;
    a third inductor section connected to the second switch;
    a third switch connected to the third inductor section; and,
    a fourth inductor section connected to the third switch.

4. The circuit of claim 3, wherein the varactor bank is a 3-bit binary varactor bank connected to the fourth inductor section and the set of core transistors.

5. The circuit of claim 1, wherein the set of inputs is a set of voltage sources defined by $$\begin{cases} V_{Q+} : A \cdot \sin(\omega t) \\ V_{Q-} : A \cdot \sin(\omega t - \pi) \\ V_{I+} : A \cdot \sin\left(\omega t - \frac{3\pi}{2}\right), \\ V_{I-} : A \cdot \sin\left(\omega t - \frac{\pi}{2}\right) \end{cases}$$

where A is a signal amplitude, ω is a frequency, and t is a time.

6. The circuit of claim 1, wherein the wide-tuning signal further comprises a tuning range of approximately 90 GHz to approximately 150 GHz.

7. A frequency generator comprising:
    a signal generation circuit;
    a phase-locked loop connected to the signal generation circuit;
    an amplifier connected to the signal generation circuit;
    a frequency doubler connected to the amplifier;
    an antenna connected to the frequency doubler;

the signal generation circuit further comprising:
- a set of wide tuning LC tanks;
- a set of core transistors cross coupled to the set of wide tuning LC tanks;
- a set of inputs connected to the set of wide tuning LC tanks and the set of core transistors;
- a set of coupling transistors connected to the set of inputs;
- a coupling capacitor connected to the set of coupling transistors;
- a load resistor connected to the coupling capacitor;

whereby the set of inputs is combined into a first signal delivered to the load resistor, amplified by the amplifier, and doubled by the frequency doubler into a second signal at the antenna.

8. The frequency generator of claim 7, further comprising a set of source inductors connected to the set of coupling transistors and the coupling capacitor.

9. The frequency generator of claim 7, wherein the first signal further comprises a first tuning range of approximately 90 GHz to approximately 150 GHz.

10. The frequency generator of claim 7, wherein the first signal is a fourth order harmonic.

11. The frequency generator of claim 7, Wherein the second signal further comprises a second tuning range of approximately 180 GHz to approximately 300 GHz.

12. The frequency generator of claim 7, wherein each wide tuning LC tank of the set of wide tuning LC tanks farther comprises:
- a tunable differential inductor; and,
- a varactor bank connected to the tunable differential inductor.

13. The circuit of chum 12, wherein the tunable differential inductor further comprises:
- a first inductor section;
- a first switch connected to the first inductor section;
- a second inductor section connected to the first switch;
- a second switch connected to the second inductor section;
- a third inductor section connected to the second switch;
- a third switch connected to the third inductor section; and,
- a fourth inductor section connected to the third switch.

14. The circuit of claim 13, wherein the varactor bank is a 3-bit binary varactor bank connected to the fourth inductor section and the set of core transistors.

15. The circuit of claim 7, wherein the set of inputs is a set of voltage sources defined by $$\begin{cases} V_{Q+} : A \cdot \sin(\omega t) \\ V_{Q-} : A \cdot \sin(\omega t - \pi) \\ V_{I+} : A \cdot \sin\left(\omega t - \frac{3\pi}{2}\right), \\ V_{I-} : A \cdot \sin\left(\omega t - \frac{\pi}{2}\right) \end{cases}$$

where A is a signal amplitude, ω is a frequency, and t is a time.

16. In a circuit comprising a set of wide tuning LC tanks, a set of core transistors cross coupled to the set of wide tuning LC tanks, a set of inputs connected to the set of wide tuning LC tanks and the set of core transistors, a set of coupling transistors connected to the set of inputs, a set of source inductors connected to the set of coupling transistors, a coupling capacitor connected to the set of source inductors, and a load resistor connected to the coupling capacitor, a method for generating a signal comprising the steps of:
- injecting a set of voltages into the set of inputs;
- mixing each voltage of the set of voltages with a square wave to create a set of mixed voltages;
- combining the set of mixed voltages into a combined voltage; and,
- delivering the combined voltage to the load resistor at a fourth harmonic frequency.

17. The method of claim 16, further comprising the step of multiplying each voltage of the set of voltages by a coefficient.

18. The method of claim 16, further comprising the step of defining the set of voltages as $$\begin{cases} V_{Q+} : A \cdot \sin(\omega t) \\ V_{Q-} : A \cdot \sin(\omega t - \pi) \\ V_{I+} : A \cdot \sin\left(\omega t - \frac{3\pi}{2}\right), \\ V_{I-} : A \cdot \sin\left(\omega t - \frac{\pi}{2}\right) \end{cases}$$

where A is a signal amplitude, ω is a frequency, and t is a time.

19. The method of claim 16, further comprising the step of attenuating a set of frequencies from the combined voltage.

* * * * *